US011211553B2

(12) United States Patent
Aggarwal et al.

(10) Patent No.: US 11,211,553 B2
(45) Date of Patent: Dec. 28, 2021

(54) MAGNETORESISTIVE DEVICES AND METHODS OF FABRICATING SUCH DEVICES

(71) Applicant: Everspin Technologies, Inc., Chandler, AZ (US)

(72) Inventors: Sanjeev Aggarwal, Scottsdale, AZ (US); Kerry Joseph Nagel, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 44 days.

(21) Appl. No.: 16/572,982

(22) Filed: Sep. 17, 2019

(65) Prior Publication Data

US 2021/0083174 A1     Mar. 18, 2021

(51) Int. Cl.
| | |
|---|---|
| *H01L 29/792* | (2006.01) |
| *H01L 43/08* | (2006.01) |
| *H01L 27/22* | (2006.01) |
| *H01L 43/02* | (2006.01) |
| *H01L 43/12* | (2006.01) |

(52) U.S. Cl.
CPC ............ *H01L 43/08* (2013.01); *H01L 27/226* (2013.01); *H01L 43/02* (2013.01); *H01L 43/12* (2013.01)

(58) Field of Classification Search
CPC ......... H01L 27/11573; H01L 27/11519; H01L 27/115524; H01L 27/115529; H01L 27/115551; H01L 27/115565; H01L 27/11557; H01L 27/11578

USPC .......................................................... 257/792
See application file for complete search history.

(56) References Cited

U.S. PATENT DOCUMENTS

| | | | |
|---|---|---|---|
| 8,432,035 B2 | 4/2013 | Kahlert et al. | |
| 8,686,484 B2 | 4/2014 | Whig et al. | |
| 8,747,680 B1 | 6/2014 | Deshpande et al. | |
| 8,790,935 B1 | 7/2014 | Nagel et al. | |
| 8,877,522 B2 | 11/2014 | Nagel et al. | |
| 9,023,216 B2 | 5/2015 | Kochergin et al. | |
| 9,136,464 B1 | 9/2015 | Whig et al. | |
| 9,412,786 B1 | 8/2016 | Andre et al. | |
| 9,419,208 B2 | 8/2016 | Whig et al. | |
| 9,548,442 B2 | 1/2017 | Aggarwal et al. | |
| 9,711,566 B1 | 7/2017 | Andre et al. | |
| 9,722,174 B1 | 8/2017 | Nagel et al. | |
| 10,103,197 B1* | 10/2018 | Andre ..................... H01L 43/02 |
| 2009/0243009 A1* | 10/2009 | Li ......................... H01L 27/228 257/422 |

(Continued)

OTHER PUBLICATIONS

Huai, Y. et al., "Spin transfer switching current reduction in magnetic tunnel junction based dual spin filter structures," Applied Physics Letters, vol. 87, p. 222510-222510-3 (Nov. 2005).

(Continued)

*Primary Examiner* — Long K Tran
(74) *Attorney, Agent, or Firm* — Bookoff McAndrews, PLLC

(57) ABSTRACT

An integrated circuit (IC) device includes a logic portion including logic circuits in multiple vertically stacked metal layers interconnected by one or more via layers, and a memory portion with a plurality of magnetoresistive devices. Each magnetoresistive device is provided in a single metal layer of the multiple vertically stacked metal layers of the IC device.

21 Claims, 19 Drawing Sheets

(56) References Cited

U.S. PATENT DOCUMENTS

| | | |
|---|---|---|
| 2010/0193850 A1 | 8/2010 | Asao et al. |
| 2012/0040207 A1 | 2/2012 | Horng et al. |
| 2012/0313191 A1* | 12/2012 | Whig .................... G11C 11/161 |
| | | 257/421 |
| 2014/0065815 A1 | 3/2014 | Tanwar |
| 2014/0190933 A1 | 7/2014 | Deshpande et al. |
| 2015/0079699 A1 | 3/2015 | Deshpande et al. |
| 2017/0125663 A1 | 5/2017 | Nagel et al. |
| 2018/0040817 A1* | 2/2018 | Chuang ................. H01L 45/146 |
| 2018/0158498 A1* | 6/2018 | Aggarwal ............. H01L 27/228 |
| 2019/0013353 A1 | 1/2019 | Lee et al. |
| 2019/0043921 A1* | 2/2019 | Andre .................... G11C 11/161 |
| 2019/0067566 A1 | 2/2019 | Nagel et al. |
| 2019/0103554 A1 | 4/2019 | Aggarwal et al. |
| 2019/0131519 A1 | 5/2019 | Ikegawa et al. |
| 2019/0140019 A1 | 5/2019 | Nagel et al. |
| 2019/0140167 A1 | 5/2019 | Aggarwal et al. |
| 2019/0157549 A1 | 5/2019 | Sun |
| 2019/0165253 A1 | 5/2019 | Sun et al. |
| 2019/0165258 A1 | 5/2019 | Peng et al. |
| 2019/0173004 A1 | 6/2019 | Deshpande et al. |

OTHER PUBLICATIONS

International Search Report in International Application No. PCT/US2020/044992, dated Oct. 19, 2020 (5 pages).

\* cited by examiner

MAGNETORESISTIVE DEVICES AND METHODS OF FABRICATING SUCH DEVICES

TECHNICAL FIELD

The present disclosure relates generally to magnetoresistive devices and methods of fabricating magnetoresistive devices.

INTRODUCTION

Magnetoresistive devices, such as magnetic sensors, magnetic transducers, and magnetic memory cells, include magnetic materials where the magnetic moments of those materials can be varied to provide sensing information or store data. Magnetoresistive devices, spin electronic devices, and spintronic devices are synonymous terms for devices that make use of effects predominantly caused by electron spin. Magnetoresistive memory devices are used in numerous information devices to provide non-volatile, reliable, radiation resistant, and high-density data storage and retrieval. The numerous magnetoresistive devices may include, but are not limited to, Magnetoresistive Random Access Memory (MRAM), magnetic sensors, and read/write heads for disk drives.

Manufacturing magnetoresistive devices includes a sequence of processing steps wherein multiple layers of materials are deposited and patterned to form a magnetoresistive stack and the electrodes used to provide electrical connections to the magnetoresistive stack. The magnetoresistive stack includes the various regions or layers that make up "free" and "fixed" portions of the device as well as one or more intermediate regions (e.g., dielectric layers) that separate these "free" and "fixed" portions, and in some cases, provide at least one tunnel junction for the device. In many instances, the layers of material in the magnetoresistive stack may be relatively very thin, e.g., on the order of a few or tens of angstroms. The term "free" refers to ferromagnetic regions having a magnetic moment that may shift or move significantly in response to applied magnetic fields or spin-polarized currents used to switch the magnetic moment vector of a "free" region. And, the term "fixed" refers to ferromagnetic regions having a magnetic moment vector that does not move substantially in response to such applied magnetic fields or spin-polarized currents.

In some applications, magnetoresistive devices may be included on the same integrated circuit with additional surrounding circuitry. For example, magnetoresistive devices (MRAMS, magnetic sensors, magnetic transducers, etc.) may be included on an integrated circuit with a microcontroller or other processing circuitry configured to utilize the information collected by, or stored in, the magnetoresistive devices. Aspects of this disclosure describe magnetoresistive devices and techniques for fabricating integrated circuits that include magnetoresistive devices that allow for efficient integration with respect to established integrated circuit manufacturing process flows.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments/aspects described herein. Further, the figures depict the different layers/regions of the illustrated stacks as having a uniform thickness and well-defined boundaries with straight edges. However, a person skilled in the art would recognize that, in reality, the different layers typically may have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain features are illustrated with straight 90-degree edges, in reality such features may be more "rounded" and/or gradually sloping or tapered.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Figure 1:
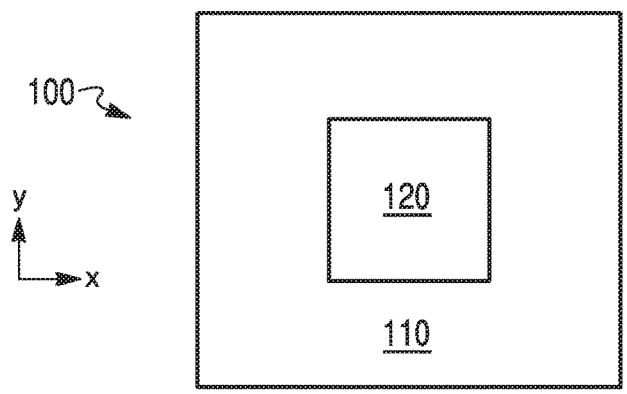
Figure 2A:
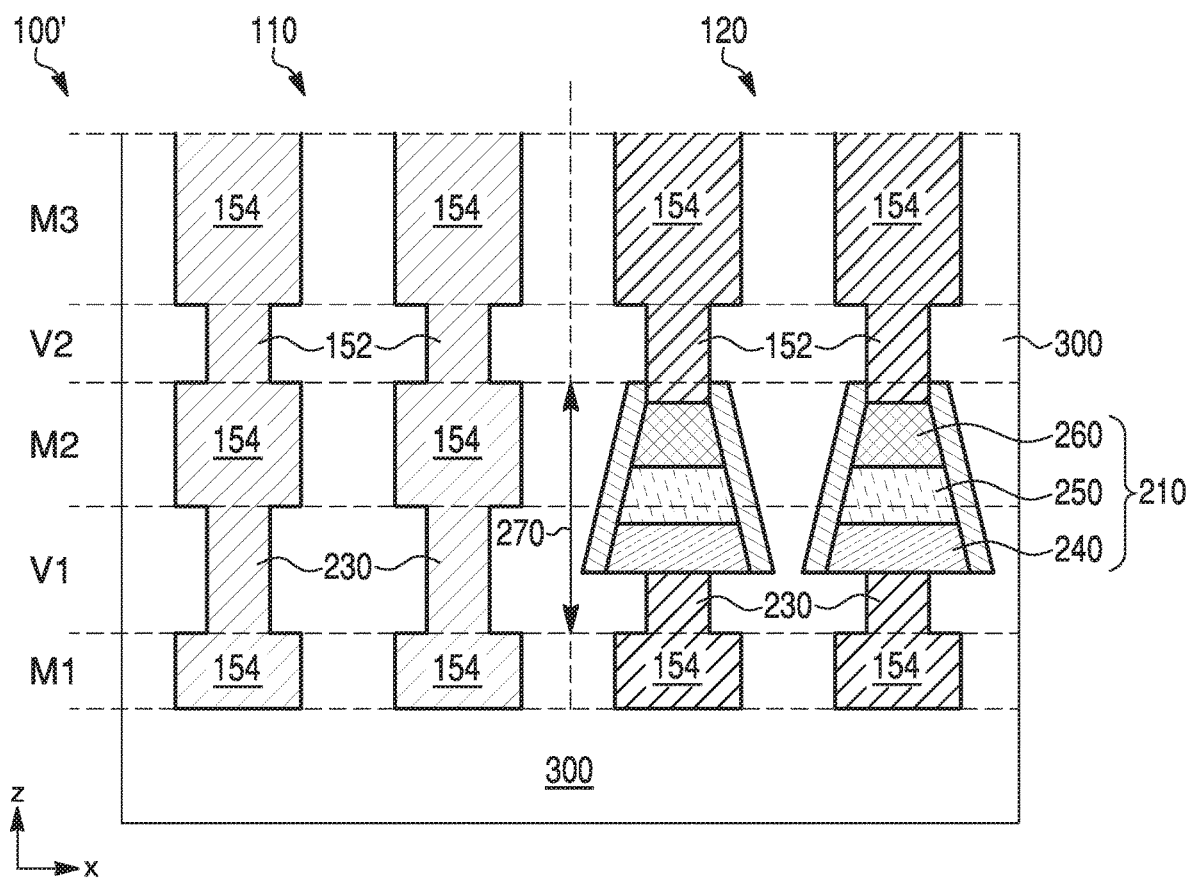
Figure 2B:
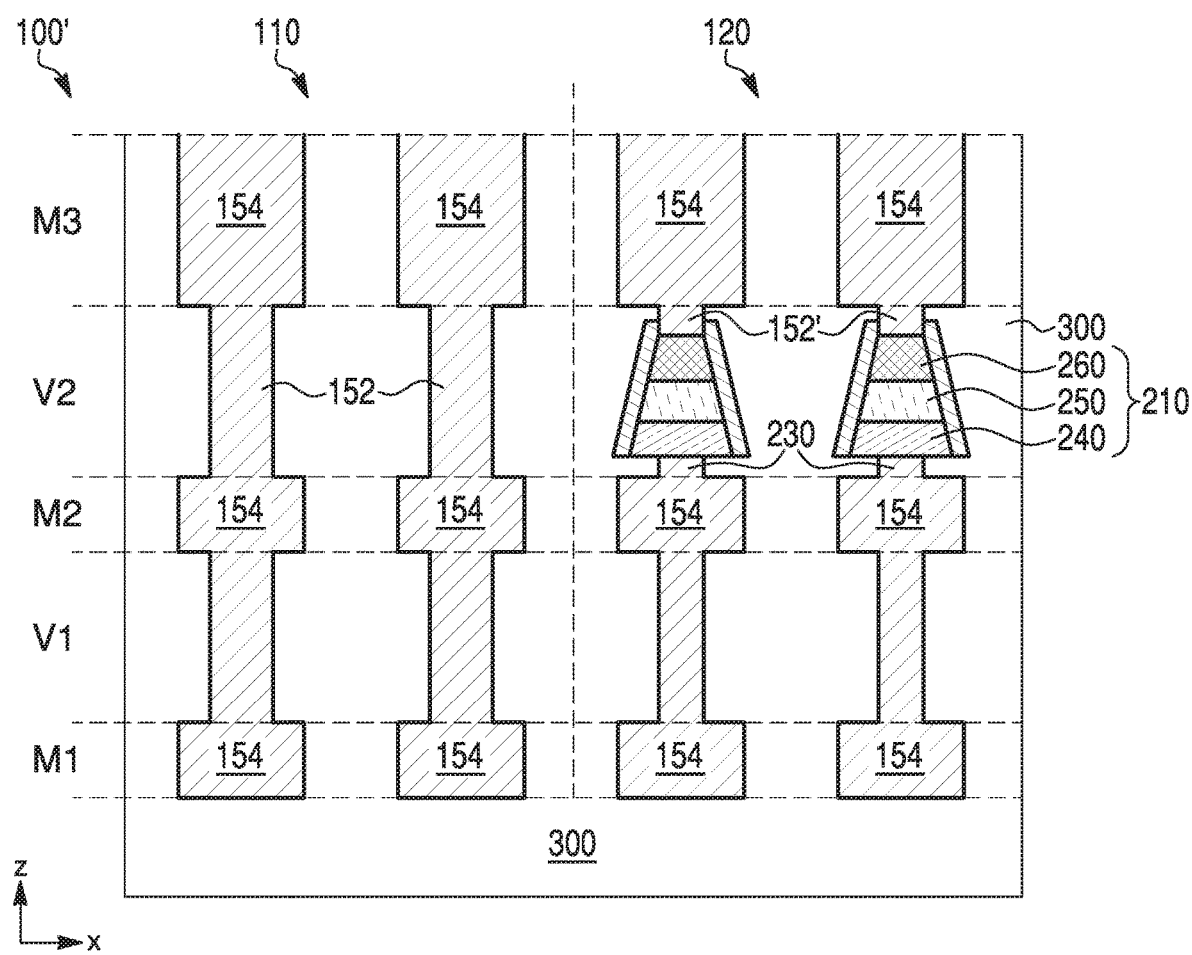
Figure 3:
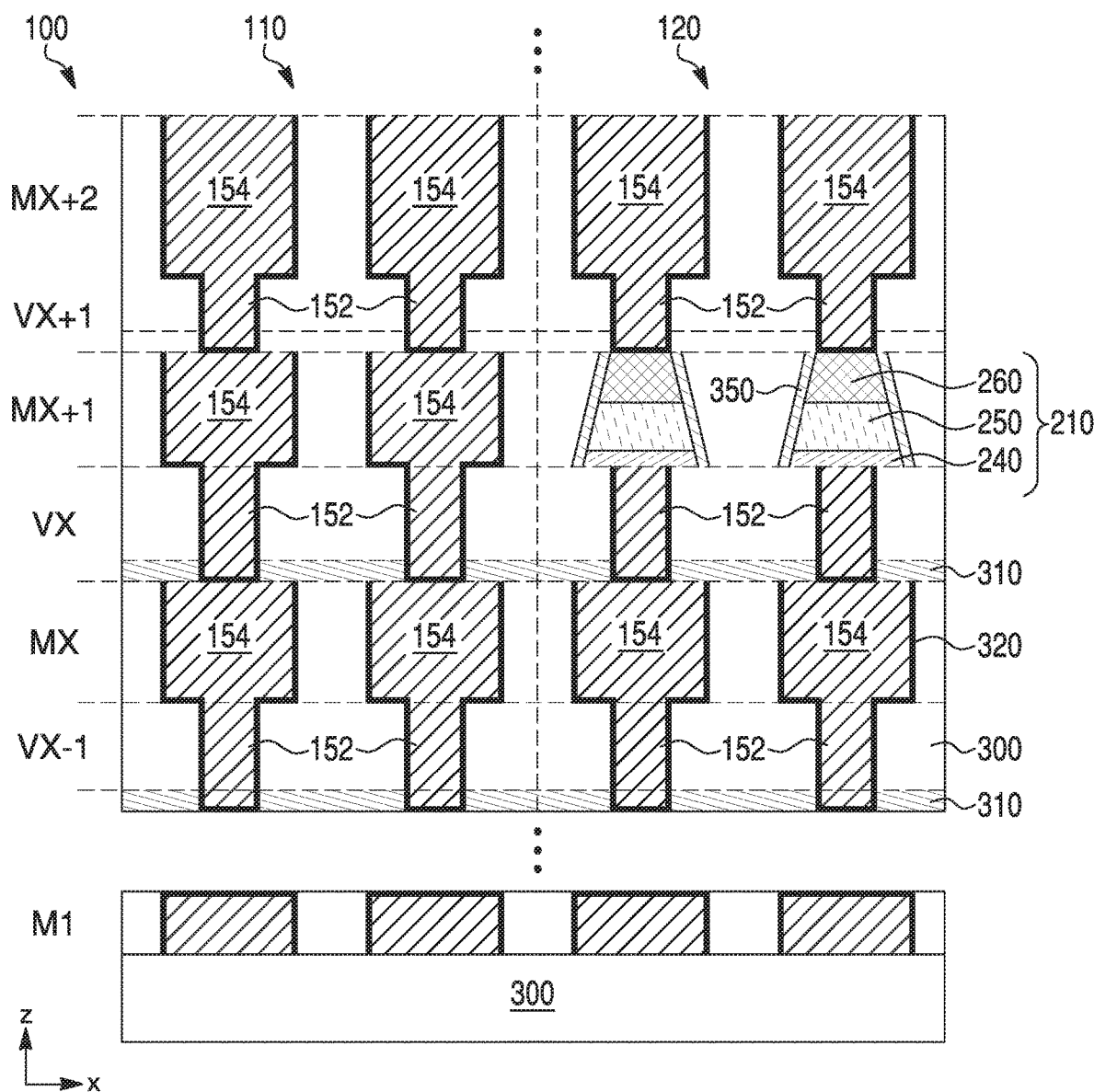
Figure 6:
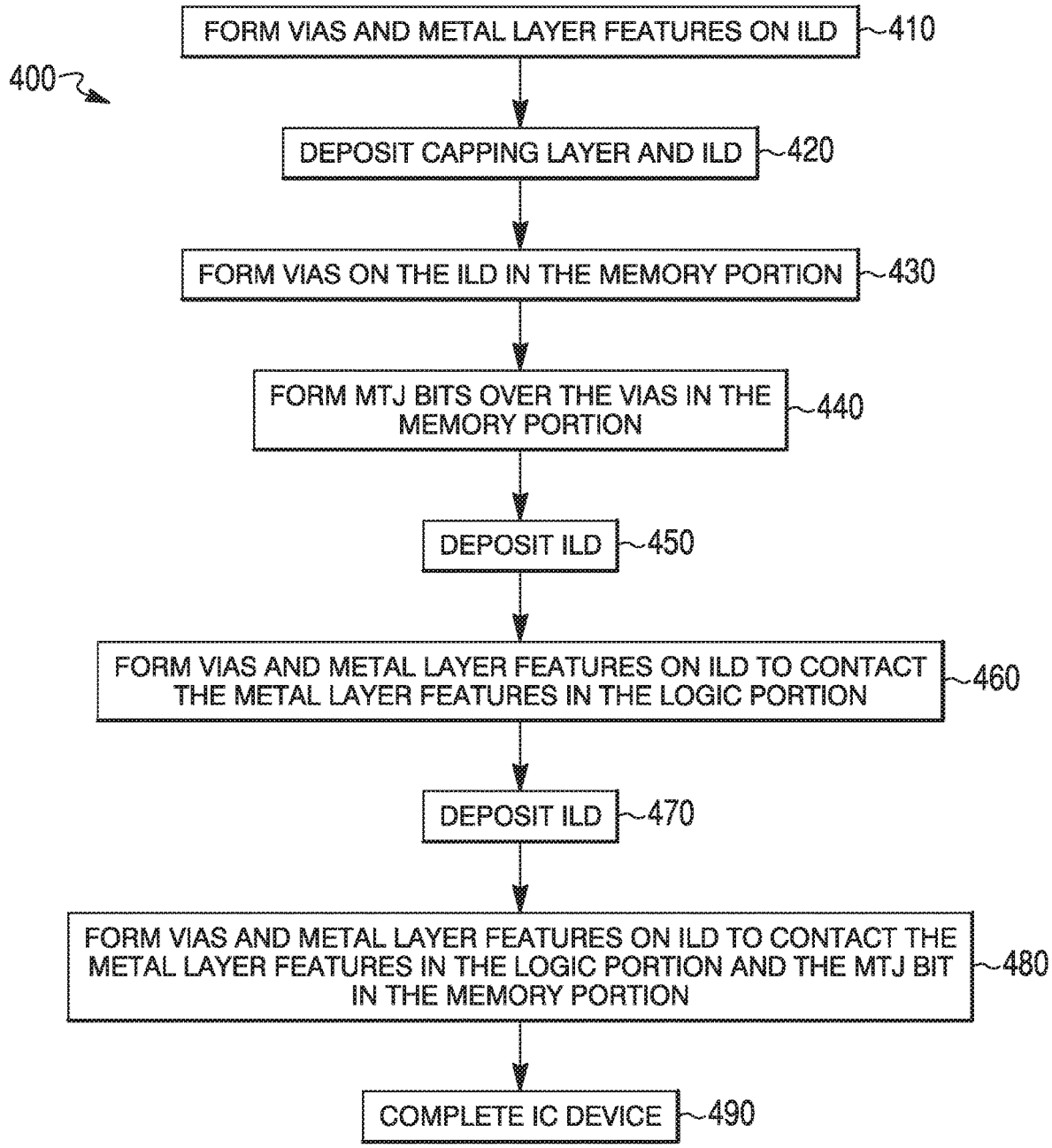
Figure 7:
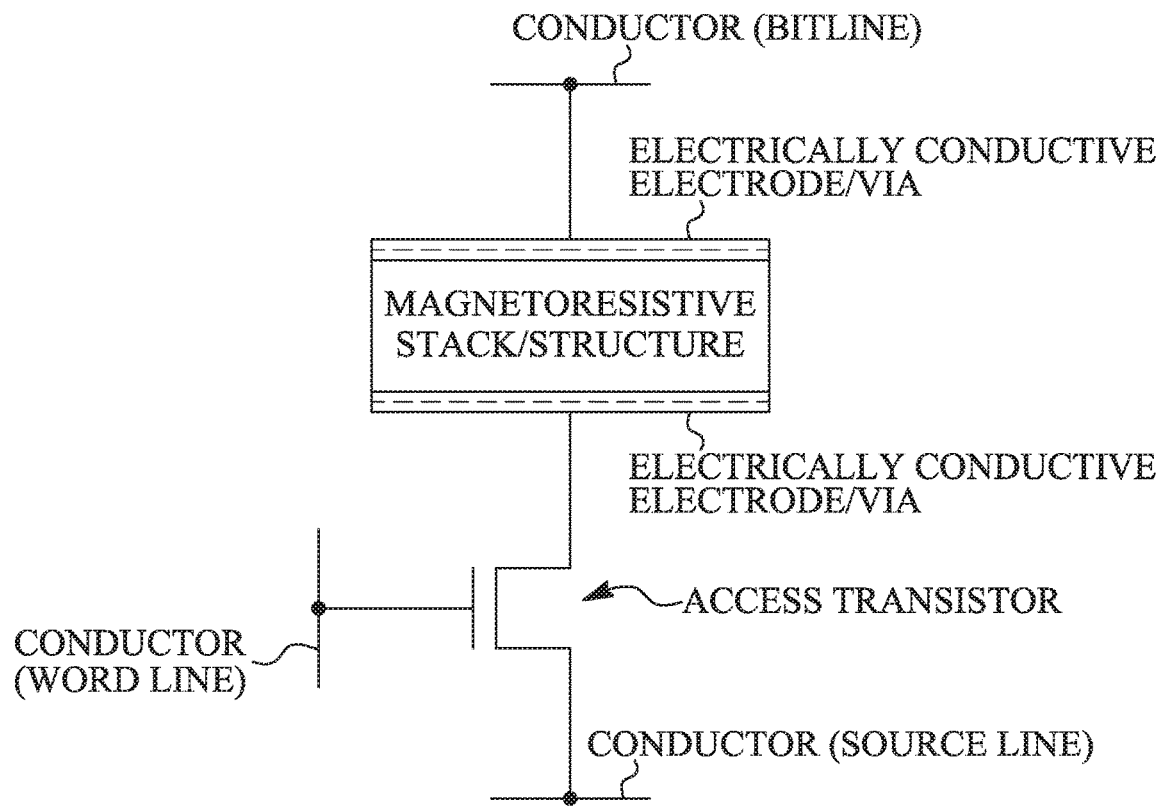
Figure 8A:
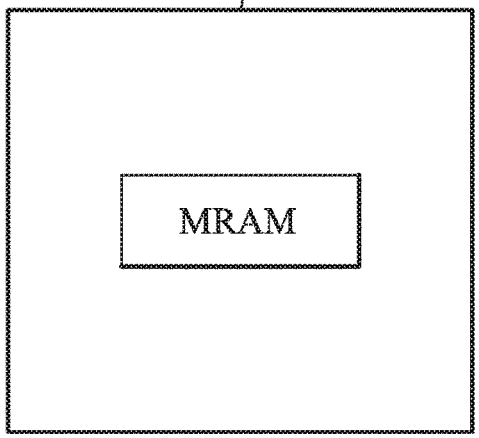
Figure 8B:
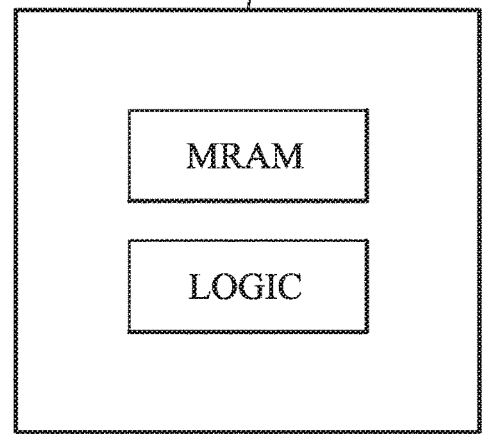

FIG. 1 is an illustration of the top view of an exemplary integrated circuit (IC) device of the current disclosure;

FIGS. 2A and 2B are cross-sectional illustrations of known IC devices with magnetoresistive devices;

FIG. 3 is a cross-sectional illustration of the disclosed IC device of FIG. 1;

FIGS. 4A-4I are schematic illustrations of the IC device of FIG. 3 at different stages of an exemplary fabrication process;

FIGS. 5A-5H are schematic illustrations of the IC device of FIG. 3 at different stages of another exemplary fabrication process;

FIG. 6 illustrates an exemplary fabrication process of the IC device of FIG. 3;

FIG. 7 is a schematic diagram of an exemplary magnetoresistive memory stack electrically connected to a select device, e.g., an access transistor, in a magnetoresistive memory cell configuration;

FIGS. 8A and 8B are schematic block diagrams of integrated circuits including a discrete memory device and an embedded memory device, respectively, each including an MRAM (which, in one embodiment is representative of one or more arrays of MRAM having a plurality of magnetoresistive memory stacks according to aspects of certain embodiments of the present disclosure); and FIGS. 9A-9D are cross-sectional illustrations of an exemplary magnetoresistive device of the IC device of FIG. 3.

DETAILED DESCRIPTION

There are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate that the embodiment(s) is/are "example" embodiment(s). Further, even though the figures and this written disclosure appear to describe a particular order of construction (e.g., from bottom to top), it is understood that the depicted structures may have the opposite order (e.g., from top to bottom), or a different order.

For the sake of brevity, conventional techniques related to semiconductor processing may not be described in detail herein. The exemplary embodiments described herein may be fabricated using known lithographic processes. The fabrication of integrated circuits, microelectronic devices, micro electro mechanical devices, microfluidic devices, and photonic devices may involve the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist may be applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that is not exposed to the radiation, is removed by the application of a developer. An etch may then be applied to the underlying layer not protected by the remaining photoresist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing integrated circuits that include magnetoresistive devices having electrically conductive electrodes on either side of a magnetic material stack. While not described in detail herein, the magnetic material stack may include many different layers of material, where some of the layers include magnetic materials, whereas others do not. In some embodiments, the methods of manufacturing include forming the layers of the magnetoresistive devices and then masking and etching those layers to produce the magnetoresistive device. Examples of such devices include transducers such as electromagnetic sensors as well as memory cells.

Magnetoresistive devices can be included on an integrated circuit with other circuitry. In such cases, it is desirable to align the process steps and structures associated with the magnetoresistive devices with the process steps and circuit features associated with the surrounding circuitry. In other words, integrating the manufacture of the magnetoresistive devices into the standard process flow used to manufacture the integrated circuits may be desirably performed in a manner that minimizes the number of additional processing steps and materials needed during production. For example, while some process steps and materials associated with building magnetoresistive devices may be specific to such devices, other process steps and materials used in manufacturing magnetoresistive devices also may be used in manufacturing the surrounding circuitry. As a specific example, conductive layers that are deposited and patterned to form the top and/or bottom electrodes for magnetoresistive devices can also be used to form connective traces and interlayer connections in standard complementary metal oxide semiconductor (CMOS) process flows. As an additional example, embodiments are disclosed in which the interlayer dielectric used in the portion of the integrated circuit that includes magnetoresistive devices is the same standard-process-flow interlayer dielectric used in the remainder of the integrated circuit. Such reuse eliminates the need for additional magnetoresistive-device-specific processing and materials.

Unless defined otherwise, all terms of art, notations and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein are incorporated by reference in their entirety. If a definition or description set forth in this disclosure is contrary to, or otherwise inconsistent with, a definition and/or description in these references, the definition and/or description set forth in this disclosure prevails over those in the references that are incorporated herein by reference. None of the references described or referenced herein is admitted to be prior art to the current disclosure.

FIG. 1 illustrates an exemplary integrated circuit (IC) device 100 that includes a logic portion 110 and a magnetoresistive device portion 120. Logic portion 110 may include logic circuits and other circuits typically manufactured using conventional process flows. The magnetoresistive device portion 120 may include magnetoresistive devices such as, for example, magnetic memory devices (MRAMs), magnetic sensors, magnetic transducers, etc. For brevity, the magnetoresistive device portion 120 is hereinafter referred to as the memory portion 120. Memory portion 120 may include any suitable configuration and number of magnetoresistive devices, and the logic portion 110 may include logic circuit elements. Although not shown in FIG. 1, in some cases, IC device 100 may include a buffer portion between logic portion 110 and memory portion 120. The buffer portion may include, e.g., "dummy" magnetoresistive devices that are not intended for active operation. Instead, such "dummy" magnetoresistive devices may be used to facilitate processing of IC device 100. For example, in some cases, polishing of IC device 100 may result in "dishing," where an uneven surface results due to the abrupt change from a high density of magnetoresistive devices in portion 120 to a lack of such devices in portion 110. To alleviate such issues, in some embodiments, the buffer portion between logic and magnetic portions 110, 120 may include "dummy" magnetoresistive devices patterned or tiled to maintain a desired density of magnetoresistive devices between portions 110 and 120. Additionally or alternatively, in some embodiments, other structures designed to facilitate processing may be provided in the buffer portion.

In IC device 100, the magnetoresistive devices and logic circuits may be intercoupled using metal layers (referred to M1, M2, M3, . . . Mx layers) and via layers (V1, V2, V3, etc.). As would be known to a person of ordinary skill in the art, the individual circuit components (e.g., transistors, capacitors, diodes, etc.) of IC device 100 are fabricated on a semiconductor wafer. These circuit components are then connected to each other to distribute signals, as well as power and ground. Since there is no room on the wafer surface to create all the required connections in a single layer, these connections are typically created in multiple vertically stacked levels of interconnects (i.e., metal layers M1, M2, etc.). Each metal layer usually includes interconnects (e.g., elongate interconnects) that extend in an in-plane direction (i.e., in the XY plane in FIG. 1). The multiple metal layers, and the interconnects of each metal layer, are separated from each other by one or more dielectric materials (i.e., interlayer dielectrics) that electrically isolate the different metal layers (M1, M2, etc.). Vias (V1, V2, etc.) between the different metal layers provide electrical connection between the different metal layers. For example, vias that connect metal features (or metallizations) in the M1 layer to the features in the M2 layer are called V1 vias, and vias that connect features in the M2 layer to features in the M3 layer are called V2 vias. Typically, a via is a relatively small opening on the interlayer dielectric between two metal layers that is filled with an electrically conductive material that provides electrical connectivity between two adjacent metal layers. As is also known to a person of ordinary skill in the art, lower-level metal layers (i.e., metal layers close to the transistors or other circuit components of IC device 100) are usually smaller than higher-level metal layers because, for example, these lower-level metal layer features attach to components that are themselves very small and often closely packed together. These lower-level metal layers—called local interconnects—are usually thin and short in length as compared to the higher-level metal layers—called global interconnects—that are typically thicker and longer. While a simple IC device may have just a few levels of metal layers (e.g., 2-4, etc.), a more complex IC device may have many more levels of metal layers (e.g., 5-10, etc.).

IC device 100 may, without limitation, have any suitable number of metal layers. Although the specific embodiments presented below describe an IC device with a particular number of metal layers, this is only exemplary. Other embodiments may include a greater or lesser number of metal layers. As explained above, the multiple layers of metal are vertically spaced-apart from each other and separated by an interlayer dielectric (ILD) layer. In order to provide electrical coupling between these multiple metal layers, vias are formed through the ILD that separates adjacent metal layers. In general, as explained above, via layer VX electrically connects metal layers MX and MX+1, etc. In some aspects, ILD may surround and insulate the vias and/or interconnect wiring of IC device 100.

In FIGS. 2A and 2B, cross-sectional views of a portion of a known IC device 100' is presented to illustrate an exemplary structure of logic and magnetic portions 110, 120 in known devices 100'. A cross-sectional view of the corresponding region in an embodiment of the disclosed IC device 100 will then be presented in FIG. 3 to illustrate some of the differences between a known IC device 100' and the disclosed IC device 100. In FIGS. 2A, 2B and 3, the two column-like vertical structures on the right side illustrate the circuitry associated with exemplary magnetoresistive devices 210 (MTJ device 210) of memory portion 120, and the two vertical structures on the left side illustrate exemplary logic circuits in logic portion 110. Although only two MTJ 210 are illustrated in the memory portion 120 of these figures, a person of ordinary skill in the art would recognize that, in reality, memory portion 120 typically includes many (e.g., hundreds, thousands, or any number) MTJ devices 210 spaced apart from each other (e.g., in both X and Y directions).

With specific reference to logic portion 110 of FIGS. 2A and 2B, the labels M1, M2, and M3 correspond to the first three metal layers of IC device 100', with layer M1 closer to the transistors (or other CMOS circuitry) formed on substrate 300 of device 100' than metal layer M3. And, the label V corresponds to the via layer between (i.e., that electrically connects) metal layers M1 and M2, and the label V2 corresponds to the via layer between metal layers M2 and M3. As illustrated in FIGS. 2A and 2B, in the logic portion 110, a feature 154 (e.g. trace, pad, or other connection point) in metal layer M1 is electrically connected to a feature 154 in the metal layer M2 (trace, pad, etc.) through via 152 in via layer V1. Similarly, a feature 154 in the metal layer M2 is electrically connected to feature 154 in the metal layer M3 using a via 152 in via layer V2. In some embodiments, features 154 and vias 152 may have a substantially circular cross-sectional shape. However, this is not a limitation. These structures may, in general, have any cross-sectional shape (square, rectangular, etc.).

It should be noted that the features 154 and the vias 152 of the different metal layers and via layers are shown as having a similar size (width/diameter, thickness, etc.) and configuration only for the sake of simplicity. As previously explained, typically, the features of the lower-level metal layers (i.e., closer to substrate 300, e.g., M1) will be substantially smaller than those in the higher-level metal layers (i.e., further away from substrate 300, e.g., M3). The illustrated relative dimensions of the metal and via layers are also exemplary. In some embodiments, the height of a via layer may be only about ½ to ⅓ the height of an adjacent metal layer. The space between the different metal and via layers in both the logic and memory portions 110, 120 are filled with ILD 300.

With continuing reference to FIGS. 2A and 2B, the memory portion 120 includes a plurality of MTJ devices 210 embedded therein. As is known to a person of ordinary skill in the art, MTJ device 210 includes a magnetoresistive stack 250 with a plurality of magnetic material layers (or regions) separated by one or more intermediate layers. In some embodiments, these intermediate layers may be made of a dielectric material and may form one or more tunnel junctions. For example, in some embodiments, magnetoresistive stack 250 may include dielectric layer sandwiched between one or more magnetic material layers on one side (that form a magnetically "free" region of MTJ device 210) and one or more magnetic material layers on the opposite side (that form a magnetically "fixed" region of MTJ device 210) to form a magnetic tunnel junction. MTJ device 210 may also include a bottom electrode 240 and a top electrode 260. Bottom and top electrodes 240, 260 may be formed of any electrically conductive material that enables the magnetoresistive stack 250 to be accessed by surrounding circuitry. In some examples, the insulating dielectric layer may be replaced with a conductive layer (e.g., a copper layer) sandwiched between the "free" and "fixed" regions.

In some known IC devices 100', an MTJ device 210 is incorporated between two alternate metal layers, such as, for example, between metal layers (M1 and M3 as illustrated in FIG. 2A, M2 and M3 as illustrated in FIG. 2B). To integrate the MTJ device 210 in the space between the two metal layers (e.g., M1 and M3), a reduced-height custom via, called a magnetic via (or Mvia 230) is fabricated to couple the bottom electrode 240 of MTJ device 210 to feature 154 of the metal layer below (i.e., M1 layer in FIG. 2A). As illustrated in FIG. 2A, the Mvias 230 that connect MTJ devices 210 to the metal layer below have a different configuration that vias 152 of the logic portion 110 in the V1 layer. For example, in some embodiments, Mvias 230 of the memory portion 120 have a relatively larger width or diameter than vias 152 in the logic portion 110. Mvias 230 with a larger width may provide landing tolerance for MTJ devices 210 that will be formed thereon. Although not illustrated in FIG. 2A, in some embodiments, Mvias 230 may have a larger width or diameter than the features 154 that it lands on to provide landing tolerance. Since Mvias 230 of the memory portion 120 and vias 152 of the logic portion 110 in the V1 layer have a different configuration, these vias (152 and 230) have to be formed using different processing steps, thereby increasing fabrication complexity and associated costs. A via 152 (sometimes called a tunnel junction via or a TJvia) couples the top electrode 260 of MTJ device 210 to a feature 154 of the metal layer above (M3 layer in FIG. 2A). See, for example, commonly-assigned U.S. Pat. Nos. 8,790,935 B1 and 9,711,566 B1 which are incorporated by reference in their entireties. As can be seen in FIG. 2A, TJVias 152 that couple MTJ devices 210 to features 154 of the M3 layer have a similar (or the same) configuration as vias 152 of the V2 layer in the logic portion 110 of IC device 100'. Since all the vias 152 in the V2 layer have a similar configuration, they may be formed using a common set of processing steps, during fabrication of device 100'. In some known IC devices 100' (e.g., in typical conventional IC devices), as illustrated in FIG. 2B, the entire MVia 230, MTJ device 210, and TJVia 152' is contained within the height of a via, such as the height of via 152 in the V2 layer, if the V2 layer via is replaced.

Note that, in IC device 100' of FIG. 2A, MTJ device 210 (i.e., bottom electrode 240, magnetoresistive stack 250, and top electrode 260) along with the customized via (i.e., Mvia 230) formed to couple MTJ device 210 to the metal layer below is fit in (or integrated in) the space (e.g., height) occupied by a metal and a via layer of the logic portion 110. That is, as illustrated in FIG. 2A, the combined height of all the layers associated with MTJ device 210 (i.e., height of Mvia 230+bottom electrode 240+magnetoresistive stack 250+top electrode 260) is substantially equal to the combined height 270 of via layer V1 and metal layer M2 (V1+M2). See, for example, commonly-assigned U.S. Pat. No. 9,412,786, which is incorporated by reference in its entirety herein. As a person of ordinary skill in the art would recognize, the absolute value of height 270 depends upon the specific metal layers between which the MTJ devices 210 are embedded (i.e., between M1 and M3, between M3 and M5, etc.) and the foundry-dependent design rules for the technology node (circuit generation, architecture, etc.) corresponding to the IC device. And, in the IC device 100' illustrated in FIG. 2B, the combined height of MVia 230+ MTJ device 210+TJ Via 152' is substantially equal to the height of the V2 via layer.

As would be recognized by a person of ordinary skill in the art, design rules specify the geometric and connectivity restrictions (including height, width, etc.) in an IC device to ensure sufficient manufacturing yield while accounting for the variabilities in the fabrication processes used to fabricate the device. In some technology nodes, design rules may require height 270 of FIG. 2A to be about 180 nm. In such cases, the height of magnetoresistive stack 250 may be about 21 nm, the height of bottom electrode 240 may be about 25 nm, the height of top electrode 260 may be 60 nm, and the height of Mvia may be about 74 nm. Thus, in FIG. 2A, the combined height of bottom electrode 240, magnetoresistive stack 250, top electrode 260, and Mvia 230 is about 180 nm (25+21+60+74), which is the same as the combined height 270 of the M2 and V1 layers.

As explained with reference to FIGS. 2A and 2B, in known IC devices, MTJ devices 210 are incorporated (or integrated) in the space occupied by a metal layer and a via layer (i.e., V1+M2 layer in FIG. 2A, or more generally, VX layer+MX+1 layer, where X can be any layer), or in the space occupied by a via layer (such as, the V2 layer as illustrated in FIG. 2B or in any other via layer). In embodiments of the current disclosure, rather than integrating MTJ devices 210 in the space occupied by a metal layer and a via layer (as in FIG. 2A), or integrating MTJ devices 210 in the space occupied by a via layer (as in FIG. 2B), the MTJ devices 210 are integrated in a metal layer (i.e., with reference to FIG. 3, in MX+1 layer rather than VX+MX+1 layer). As will be explained later, integrating MTJ devices only in a metal layer may advantageously result in die size reduction and reduce the possibility of electrical shorts in device 100. FIG. 3 is a cross-sectional view of a portion of IC device 100 of FIG. 1 that shows exemplary MTJ devices 210 integrated in a metal layer MX+1. As explained above, metal layer MX+1 may be any metal layer of device 100. That is, if IC device 100 has 8 metal layers (M1 to M8), metal layer MX+1 may be any metal layer from M1 to M8. Since the configuration of MTJ devices 210 and other circuit elements (e.g., features 154, vias, 152, etc.) of IC device 100 of FIG. 3 are the substantially similar to those in IC device 100' of FIGS. 2A and 2B, they are not described again with reference to FIG. 3.

As illustrated in FIG. 3, MTJ devices 210 are integrated solely in metal layer MX+1 of IC device 100. That is, the height of MTJ device 210 (i.e., the height of bottom electrode 240+magnetoresistive stack 250+top electrode 260) is substantially equal to the height of the MX+1 layer. Since the MTJ devices 210 have similar height as the features of a metal layer, the Mvias 230 (see FIG. 2A) that connect MTJ devices 210 to the metal layer below (i.e., MX layer in FIG. 3) is eliminated in IC device 100, and vias similar in configuration to vias 152 in the logic portion 110 (of the same via layer) is used to connect MTJ devices 210 to the metal layer below. That is, as illustrated in FIG. 3, vias 152 that connect the bottom electrodes 240 of MTJ devices 210 to features 154 of the MX layer is similar in configuration (e.g., size, etc.) to other vias 152 of the VX layer. That is, as illustrated in FIG. 3, in IC device 100, all the circuit elements associated with MTJ device 210 (i.e., bottom electrode 240, magnetoresistive stack 250, and top electrode 260) is fit into (or integrated in) the space (e.g., height) occupied by only metal layer MX+1. Compared with a known IC device 100' of FIG. 2A, in the embodiment of FIG. 3, the Mvia 230 of FIG. 2A is replaced with a via 152 that has a similar (or the same) configuration as the corresponding vias 152 in the logic portion 110. Therefore, in some embodiments, vias 152 of both the logic and memory portions 110, 120 may be formed using similar processing steps, thereby simplifying fabrication.

Although the configuration of both MTJ devices 210 of FIG. 3 are shown to be identical, this is only exemplary. In some cases, there may be variations between the different MTJ devices 210 embedded in memory portion 120. Although in some cases, the differences in configuration can be intentional (e.g., MTJ devices 210 designed to be different), typically, the differences in configuration between different MTJ devices 210 in memory portion 120 occur as a result of variations during processing (e.g., deposition, etching, etc.). For example, variations during deposition and/or etching may cause differences in the heights of the top electrodes 260 (and/or other components) in different MTJ devices 210. Because of such variations, the height of MTJ devices 210 may not necessarily be exactly the same as the height of features 154 of MX+1 layer (which may also vary across the device 100). Instead, in embodiments of the current disclosure, the average height of MTJ devices 210 (i.e., combined height of bottom electrode 240, magnetoresistive stack 250, and top electrode 260) in memory portion 120 may be substantially the same as the average height of features 154 of metal layer MX+1 in the logic portion 110. In other words, MTJ devices 210 (i.e., bottom electrode 240, magnetoresistive stack 250, and top electrode 260) of memory portion 120 may substantially fit into the space (e.g., height) occupied by metal layer MX+1.

As illustrated in FIG. 3, ILD 300 may fill the space between the metal features of IC device 100. ILD 300 may include a conventional ILD material (such as, for example, TEOS, $SiO_2$, etc.) or a low-k ILD material (such as, for example, carbon doped $SiO_2$ (SiOC), carbon doped oxide (CDO), organo silicate glass (OSG) spin-on organics, etc.). Although a single ILD 300 is illustrated in FIG. 3, this is only exemplary. In some embodiments, multiple ILDs may be used. For example, some regions of the device (e.g., metal layers or portions of metal layers) may use one ILD (e.g., a conventional ILD) and other regions of the device may use another ILD (e.g., a low-k ILD). See, for example, commonly-assigned U.S. Patent Application Publication No. 2019/0140019 A1, which is incorporated by reference in its entirety herein.

As illustrated in FIG. 3, in some embodiments, a capping layer 310 may be provided between the different metal layers. Capping layer 310 may provide a barrier to migration for the underlying metal layer (e.g., prevent or reduce copper diffusion) and also act as an etch stop during fabrication of the overlying structures (e.g., during etching of the overlying vias). Any material suitable for these functions may be used as capping layer 310. In some embodiments, capping layer 310 may include materials, such as, for example, silicon carbide (SiC), silicon nitride (SiN), a nitrogen-doped silicon carbide (e.g., NBLoK from Applied Materials, Inc.), etc. IC device 100 may also include a barrier layer 320 (or one or more barrier layers), for example, to reduce electromigration of copper (or another electrical conductive material used to form the metal structures of device 100). Barrier layer 320 may be formed of materials, such as, for example, for example, tantalum nitride, tantalum, titanium nitride, titanium-tungsten, tungsten, tungsten nitride, titanium silicon nitride, silicon nitride, cobalt, ruthenium, etc.

As would be recognized by a person skilled in the art, IC device 100 may also include additional layers (not shown), such as, for example, transition layers, etch stop layers, barrier layers, etc. See, for example, U.S. Pat. No. 8,432,035 and U.S. Patent Application Publication No. 2014/0065815, which are incorporated by reference in their entireties herein. Since exemplary materials and structures in an IC device, and their functions, are well known in the art, they are not described in detail herein. Further, although a specific configuration of MTJ device 210 and magnetoresistive stack 250 is illustrated in FIG. 3, MTJ device 210 may include any type of magnetoresistive device known in the art, and magnetoresistive stack 250 may be any type magnetoresistive stack known in the art. In general, MTJ device 210 may be any type of in-plane or out-of-plane (i.e., perpendicular) magnetically anisotropic MTJ device, and may include any type of now-known or later developed magnetoresistive stack 250.

Figure 9A:
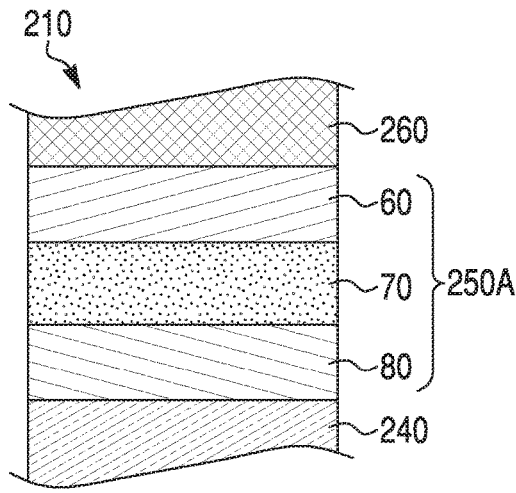
Figure 9B:
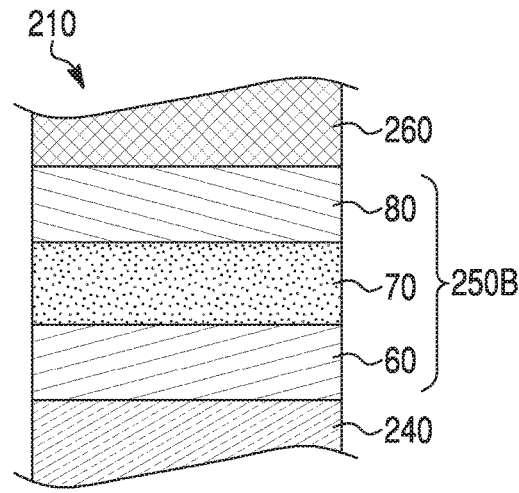
Figure 9C:
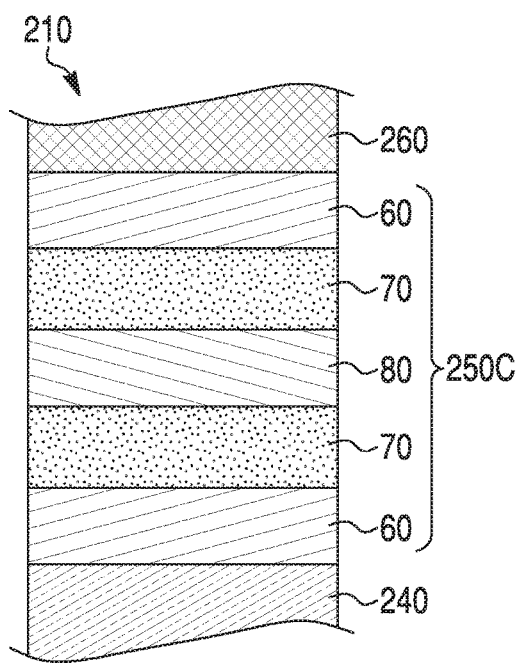
Figure 9D:
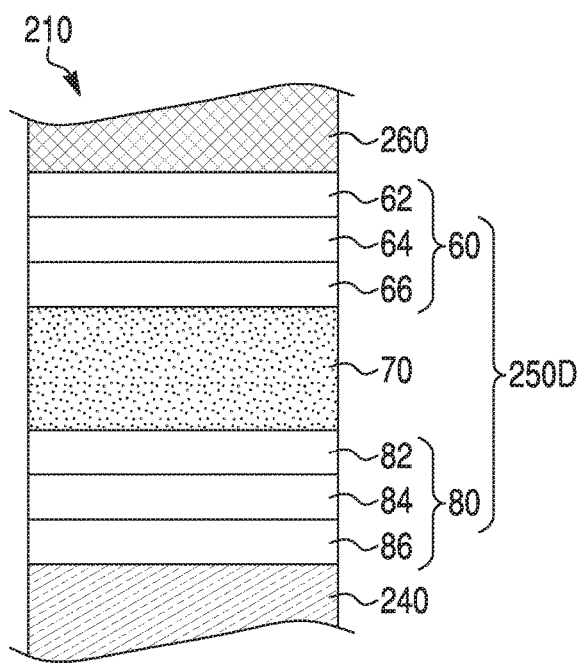

FIGS. 9A-9D depict cross-sectional views of different exemplary magnetoresistive stacks 250A-250D of an exemplary MTJ device 210 that may be used in FIG. 3. In the discussion below, reference will be made to FIG. 3 and FIGS. 9A-9D. In general, magnetoresistive stack 250 may comprise at least one fixed magnetic region 60 (or fixed region 60), at least one free magnetic region 80 (or free region 80), and at least one intermediate region 70 disposed between the fixed region 60 and the free region 80. In some embodiments, magnetoresistive stack 250 may have a dual spin filter structure with two intermediate regions 70 as shown in FIG. 9C. The fixed region 60 may be provided below the free region 80 (i.e., fixed region 60 proximate bottom electrode 240 and free region 80 proximate top electrode 260) as illustrated in FIG. 9B, or the fixed region 60 may be provided above the free region 80 as shown in FIG. 9A. In some embodiments, fixed region 60 may include one or more layers 62, 66 of ferromagnetic alloys (comprising, e.g., some or all of cobalt, iron, nickel, and boron, etc.), and/or free region 80 may comprise one or more layers 82, 86 of ferromagnetic alloys (comprising e.g., nickel, iron, cobalt, etc.) separated by a antiferromagnetic (AF) coupling layer 64, 84 (comprising, e.g., tantalum, tungsten, molybdenum, ruthenium, rhodium, rhenium, iridium, chromium, osmium, etc.). As a person of ordinary skill in the art would recognize, many commonly used layers (e.g., seed layers, transition layers, reference layers, etc.) are not shown in the exemplary stacks of FIGS. 9A-9D for the sake of simplicity. It should be noted that the stacks shown in FIGS. 9A-9D are only exemplary and MTJ device 210 may have any now-known or future developed magnetoresistive stack (including one or more synthetic antiferromagnetic (SAF) structures, synthetic ferromagnetic (SyF) structures, etc.). U.S. Pat. Nos. 8,686,484; 8,747,680; 9,023,216; 9,136,464; and 9,419,208, and U.S. Patent Application Publication Nos: 2018/0158498; 2019/0165253; 2019/0173004; 2019/0131519; 2019/0140167, and 2019/0157549, each of which is assigned to the assignee of the current application, describe exemplary MTJ devices and exemplary magnetoresistive stacks that may be used in IC device 100 of FIG. 3. These references are incorporated by reference in their entirety herein.

A method of manufacturing IC device 100 will now be described. Since different processes (e.g., deposition techniques, etching techniques, polishing techniques, etc.) involved in the manufacturing of IC devices are well known in the art, detailed description of these techniques is omitted for the sake of brevity. Since MTJ devices 210 of IC device 100 are integrated in the MX+1 layer, processing of the metal layers below and above the MX+1 layer may be performed using conventional IC fabrication processes known in the art. Therefore, for the sake of brevity, processing of IC device 100 below the MX+1 layer, and above the MX+1 layer, is not described in detail herein. In some embodiments, during fabrication of IC device 100, processing of memory portion 120 may be compartmentalized, such that, before such processing begins and/or after such processing is complete, a known standard process flow for IC device 100 may be used. In some embodiments, some of the standard process steps and materials may also be used in the compartmentalized portion of the processing (e.g., the processing used for memory portion 120), thereby reducing any additional burden associated with the inclusion of MTJ devices 210 in IC device 100. For example, as explained previously, in the VX layer of FIG. 3, the standard process steps used to fabricate vias 152 in the logic portion 110 may also be used to fabricate vias 152 in the memory portion 120, thereby simplifying the fabrication process.

FIGS. 4A-4I are a simplified cross-sectional views at different stages during an exemplary fabrication process of IC device 100 of FIG. 3. As explained above, since conventional processing steps are used to fabricate the device up to the MX layer, these processing steps will not be described in detail. Briefly, metal patterns, or features, corresponding to the M1 layer are formed (deposited, patterned, etched, etc.) on the back end of a semiconductor substrate 300 (see FIG. 3) having CMOS circuitry. These features may be made of any electrically conductive material (copper, aluminum, suitable alloys, etc.) and may include any type of feature (such as, for example, a landing pad, conductive trace, etc.) that provides electrical connection to the CMOS circuitry within the die. As is known to a person of ordinary skill in the art, the features may be formed using known lithographic and deposition steps. ILD 300 may be deposited over the features of a lower-level metal layer, and features and vias may be formed on the deposited ILD, for example, using a dual-damascene process. For example, with reference to FIG. 4A, ILD 300 may be deposited and patterned using standard lithography and etching techniques to form a cavity or a trench that, when filled with a conductive material (e.g., copper), will form vias 152 of the VX-1 layer and features 154 of the MX layer. Barrier layer 320 may then be deposited in the trench. Barrier layer 320 may reduce the migration of copper atoms into ILD 300 and may also provide good adhesion to copper. After deposition of barrier layer 320, a thin copper seed may be deposited (e.g., by physical vapor deposition (PVD)) in the trench. This may be followed by the electroplating of copper which fills the trench to form vias 152 and features 154. During this process, excess copper may be deposited on the exposed surfaces of ILD 300. This excess copper may be removed by a chemical mechanical polishing (CMP) process (e.g., copper CMP), and capping layer 310 deposited on the polished ILD surface. Different metal and via layers are formed by repeating these process steps for each level of metallization.

Figure 4A:
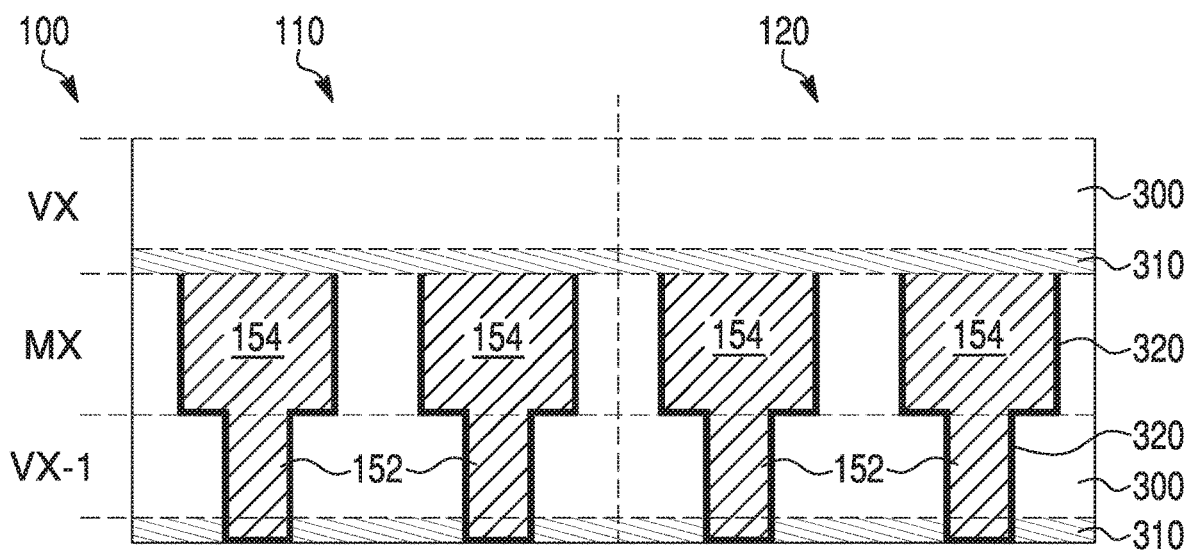
Figure 4B:
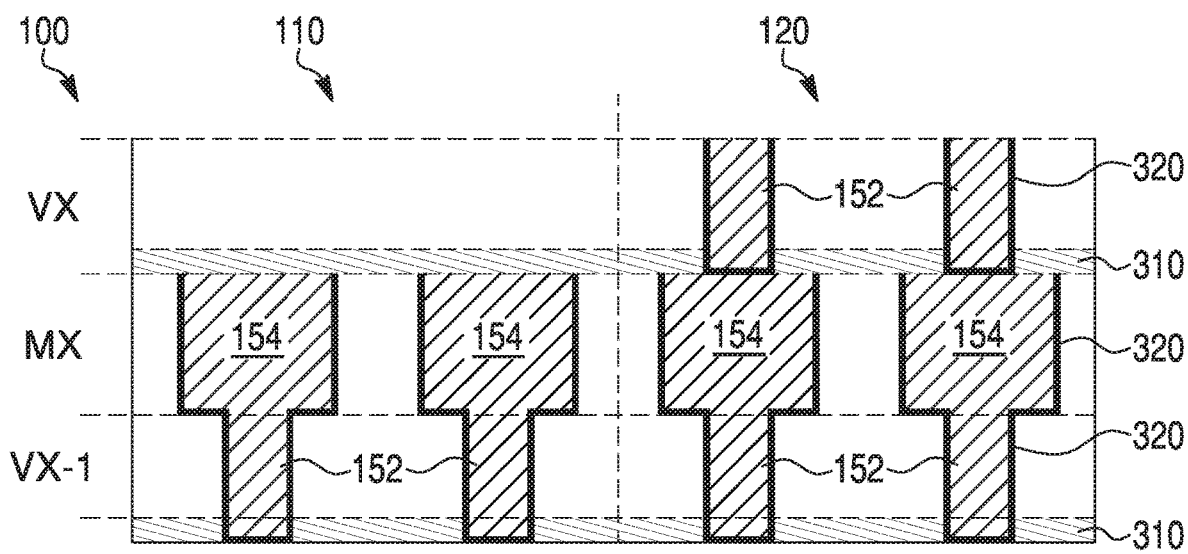

With reference to FIGS. 4A and 4B, after forming vias 152 of the VX-1 layer and features 154 of the MX layer of both the logic and memory portions 110, 120 (e.g., using the above-described dual-damascene process), ILD 300 is deposited above (or on) capping layer 310. Note that, in some embodiments, other layers may also be deposited between capping layer 310 and ILD 300. Vias 152 of the VX layer are then formed through ILD 300 in the memory portion 120 of the device, using, for example, a single damascene process. For example, ILD 300 above the logic portion 110 of IC device 100 may be masked (e.g., covered by photoresist, etc.), and trenches (or cavities in the regions through which vias 152 will pass) are patterned on the ILD 300 in the memory portion 120. These trenches are then coated with barrier layer 320 and filled with copper to form vias 152 of the VX layer in memory portion 120. The size of the vias 152 formed depend upon the design rules for the via layer that is being formed. For example, design rules for some technology nodes may require the V3 vias to have a width (or diameter) of 32 nm and a height of 53 nm. Therefore, if these design rules are followed and vias of the V3 layer are being formed (i.e., if VX of FIG. 4B corresponds to V3), then vias 152 of FIG. 4B will be formed to have a width of 32 nm width and a height of 53 nm. After filling the vias 152, excess copper that is deposited on the surface of ILD 300 is removed by, for example, chemical mechanical polishing (CMP) or another suitable process step (e.g., etch-back). The CMP (or etch-back) also planarizes the surface of the ILD 300 for subsequent processing.

Figure 4C:
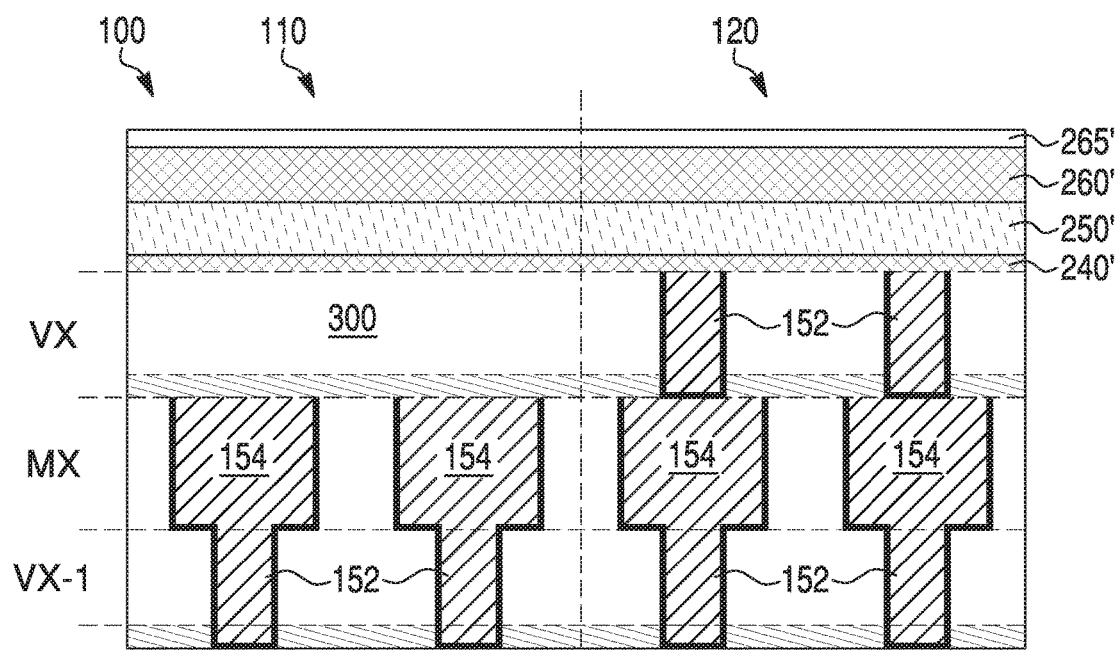

With reference to FIG. 4C, blanket layers of materials that will form different regions of MTJ devices 210 are then sequentially deposited (e.g., deposited one over the other) on the planarized surface of ILD 300. These multiple layers include layers 240', 250', and 260' that, after processing, will form the bottom electrode 240, magnetoresistive stack 250, and top electrode 260, respectively, of MTJ device 210 (of FIG. 3). Any suitable electrically conductive material, such as, for example, tantalum (Ta), titanium (Ti), tungsten (W), tantalum-nitride alloy, etc. may be used to form bottom and top electrode layers 240' and 260'. The magnetoresistive stack 250 is formed by sequentially depositing the different layers of the stack 250 (e.g., the layers described with reference to FIGS. 9A-9D). Since these layers and materials that form these layers are known and are described in references incorporated by reference herein, they are not discussed in detail. See, for example, commonly-assigned U.S. Patent Application Publication Nos: 2019/0173004; 2017/0125663; 2019/0103554; 2019/0067566, and U.S. Pat. Nos. 8,686,484; 8,747,680; 9,023,216; 9,136,464; 9,412,786; 9,419,208; and 9,722,174, each of which is incorporated by reference in its entirety herein.

As shown in FIG. 4C, a hard mask layer 265' may also be deposited over the top electrode layer 260'. Hard mask layer 265' may serve as a hard mask during subsequent processing (etching, patterning, etc.) of the magnetoresistive stack 250 to form MTJ devices 210. For example, hard mask layer 265' may protect the underlying layers of the stack 250 from reactive compounds and gases used in the etching processes used to form MTJ devices 210 from magnetoresistive stack 250. In some embodiments, materials such as, for example, silicon oxide, silicon nitride, and/or another material that is relatively inert to the reactants used during subsequent processing, may be deposited to form hard mask layer 265'. In some embodiments, hard mask layer 265' may be a metal hard mask, and may include one or more layers of metals, such as, for example, platinum (Pt), iridium (Ir), molybdenum (Mo), tungsten (W), ruthenium (Ru), and alloys, such as, for example, titanium-nitride (TiN), platinum manganese (PtMn), iridium-manganese (IrMn), etc. Some exemplary hard masks are described in commonly-assigned U.S. Patent Application Publication Nos. 2015/0079699 A1, and 2014/0190933 A1, which are incorporated by reference in their entireties herein.

Figure 4D:
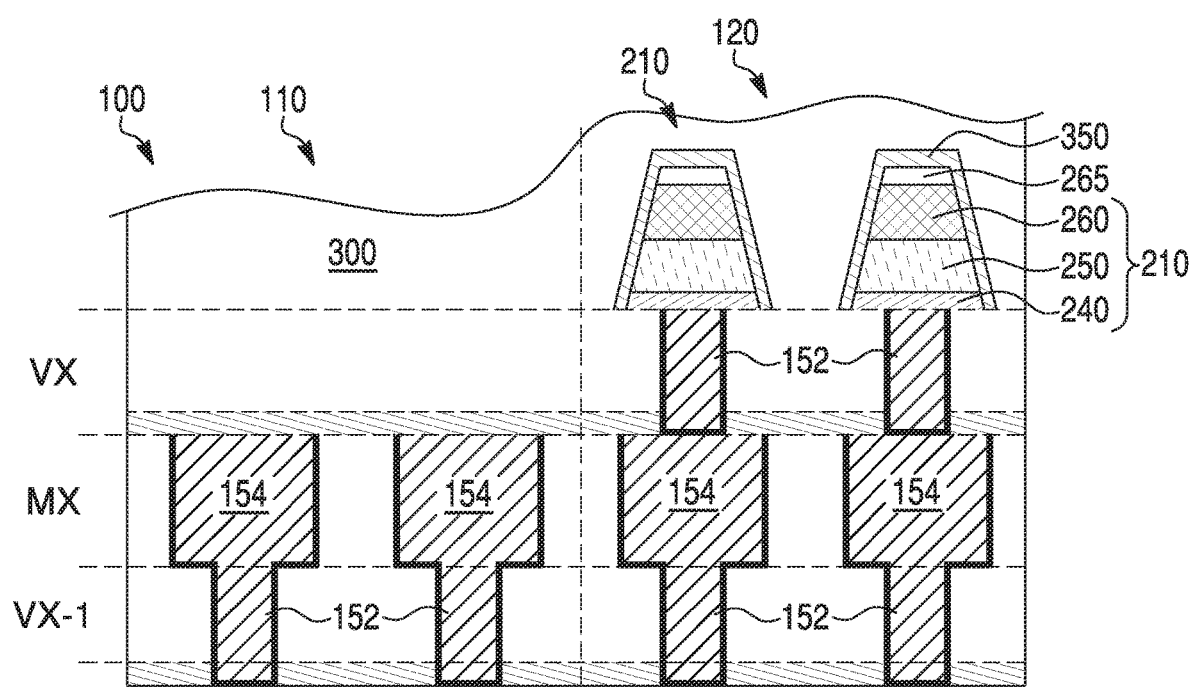

As shown in FIG. 4D, the blanket layers of materials (of FIG. 4C) are then etched for form MTJ devices 210. The formed MTJ devices 210 encapsulated with an encapsulating material (or encapsulant 350), and ILD 300 deposited over the encapsulated MTJ devices 210. Any now known etching process (e.g., sputter etching, ion beam etching (IBE) or milling, reactive ion beam etching (RIE) or milling, etc.) or later developed etching process may be used to etch through the different blanket layers to form MTJ devices 210. In some embodiments, a photo resist may be deposited on hard mask layer 265' and patterned to form hard mask 265 over the desired pattern of MTJ devices 210. The underlying layers may then be etched with the patterned hard mask 265 serving as a mask to form MTJ devices 210. Since the processing steps (etching, encapsulating, etc.) used to form MTJ devices 210 from blanket layers are known in the art, they are not described herein. See, for example, U.S. Patent Application Publication Nos. 2017/0125663 A1 and 2019/0173004 A1. After etching, as shown in FIG. 4D, a portion of the hard mask 265 may be retained atop the MTJ devices 210. As also shown in FIG. 4D, due to the isotropic nature of the etching used to form MTJ devices 210, in some embodiments, the formed MTJ devices 210 may have sloping sidewalls (or a frustoconical shape).

After forming the MTJ devices 210, an encapsulating material (encapsulant 350) is deposited on the MTJ devices 210 to form a conformal coating over the exposed regions of the devices 210 (including their side walls). In some embodiments, encapsulant 350 may include any electrically nonconductive material, such as, for example, silicon nitride, silicon oxide, aluminum nitride, aluminum oxide, TEOS, etc. In some embodiments, a conductive material, such as, (e.g., aluminum, magnesium, etc.) may first be deposited and then oxidized or nitridized to form encapsulant 350. Any suitable process (e.g., chemical vapor deposition (CVD), atomic layer deposition (ALD), etc.) may be used to deposit encapsulant 350. In some embodiments, encapsulant 350 may first be deposited over the entire field to cover both the logic portion 110 and the memory portion 120, and the deposited encapsulant 350 etched such that only the MTJ devices 210 remain covered by the encapsulant 350 (as illustrated in FIG. 4D). ILD 300 is then deposited over the encapsulated MTJ devices 210 to form a conformal coating over both the logic and memory portions 110, 120. Because of the MTJ devices 210 in memory portion 120, the surface of the deposited ILD 300 may have an uneven topography (e.g., have peaks and valleys) as illustrated in FIG. 4D.

The size of the formed MTJ devices 210 will depend on the metal layer on which the devices 210 are formed and the design rules for the technology node. In some embodiments, when MTJ devices 210 are formed on the M4 layer on V3 vias 152 having a width of 32 nm (i.e., when metal layer MX+1 of FIG. 4G is M4), the size (e.g., width, diameter, etc.) of MTJ devices 210 may be about 50 nm. That is, in some embodiments, as illustrated in FIG. 4D, the width of the bottom electrode 240 of MTJ devices 210 may be bigger than via 152 on which the devices 210 are formed. The smaller via below the device 210 reduces (or eliminates in some cases) redeposition of the underlying via material on the side walls of MTJ device 210 (or in the space between the devices 210) during etching of MTJ devices 210. As known to people skilled in the art, the etching processes (such as IBE and RIE that may be used to etch the blanket layers 240', 250', 260' of FIG. 4C) used to form MTJ devices 210 use beams of charged ions to etch through the blanket layers 240', 250', and 260'. During this etching, the impact of the ions ablates areas of the layers not covered by the hard mask 265. A portion of the ablated material may get redeposited on the side walls of the MTJ devices 210 during the etching process. The redeposited material detrimentally affects the resistance and magnetic properties of the MTJ devices 210 and also may result in electrical shorting of these devices 210. Landing the MTJ devices 210 on a smaller sized via 152 eliminates (or reduces) the possibility of the material of the via 152 from being ablated and getting redeposited (on the side walls of the MTJ devices 210 or in the space between the devices 210) during the etching process.

Figure 4E:
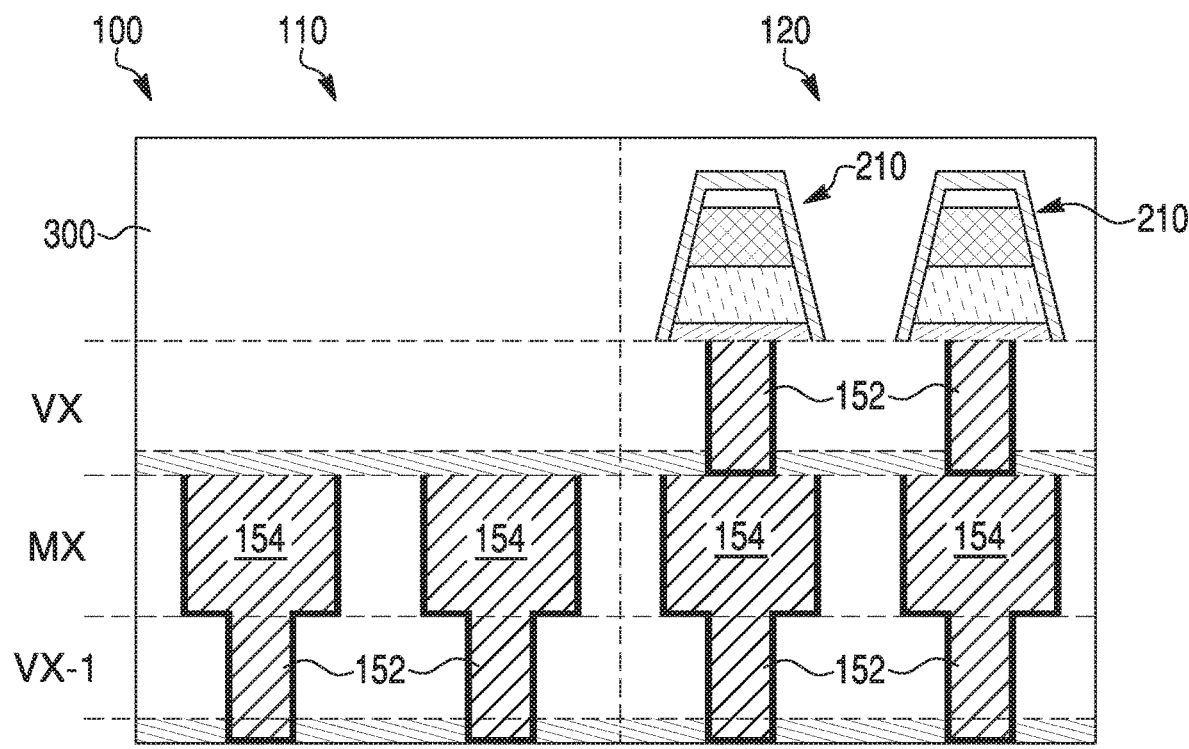

With reference to FIG. 4E, the surface of ILD 300 is then planarized to remove (or reduce) the unevenness of the ILD topography and prepare the surface for subsequent processing. In some embodiments, an etch-back process may be used to planarize the surface of ILD 300. Any suitable etch-back process known in the art may be used to planarize the surface of ILD 300. Typically, the etch-back process used (i.e., etchant, process conditions, etc.) will depend upon the material used as ILD 300. In some embodiments, CF4 gas and/or other etching gases (e.g., composed of C, H, and F) may be used in a RIE process to etch the surface of ILD 300. As shown in FIG. 4E, the etch-back process may be stopped before exposing the encapsulated MTJ devices 210. Although the surface of the ILD 300 is shown to be substantially planar after planarization in FIG. 4E, in some embodiments, after etch-back, the surface of ILD 300 in an area between the logic and memory portions 110, 120 may be uneven (see, for example, FIG. 5D). In some embodiments, instead of an etch-back process, a CMP process may be used to planarize the surface of ILD 300. Planarizing the surface of ILD 300 using an etch-back process (rather than CMP) may reduce non-uniformity of the surface and/or reduce the possibility of cross-contamination between the logic and memory portions 110, 120.

Figure 4F:
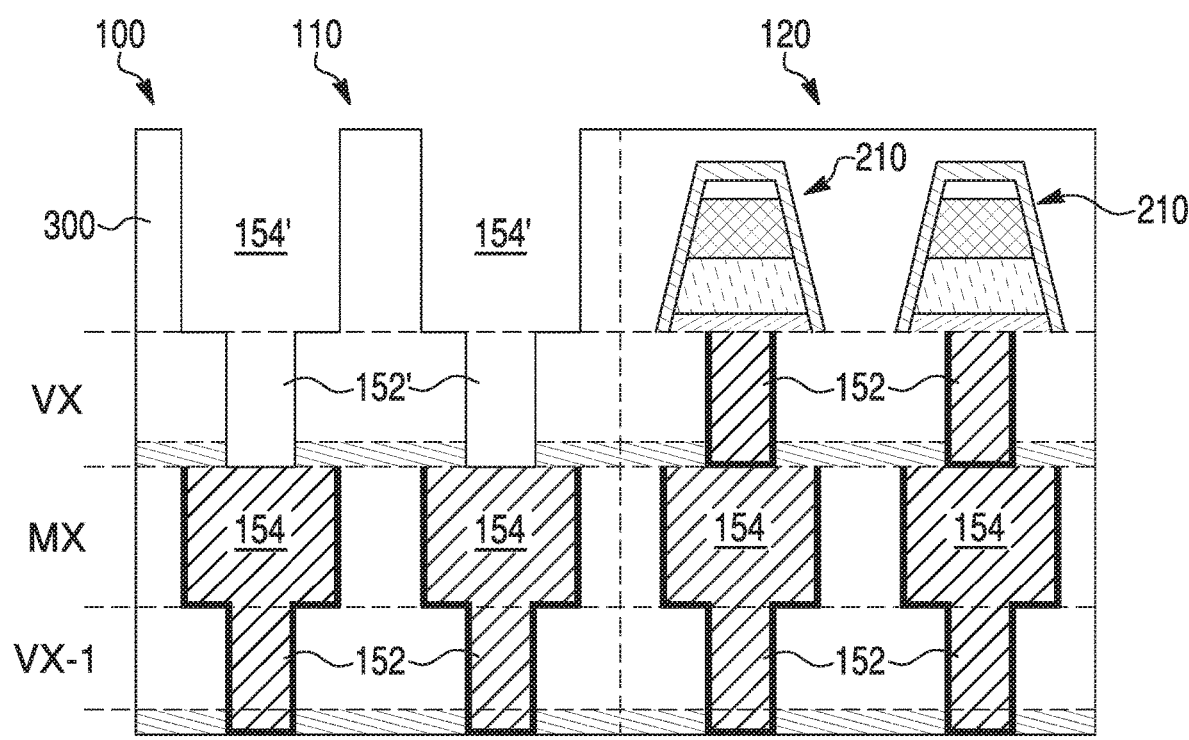
Figure 4G:
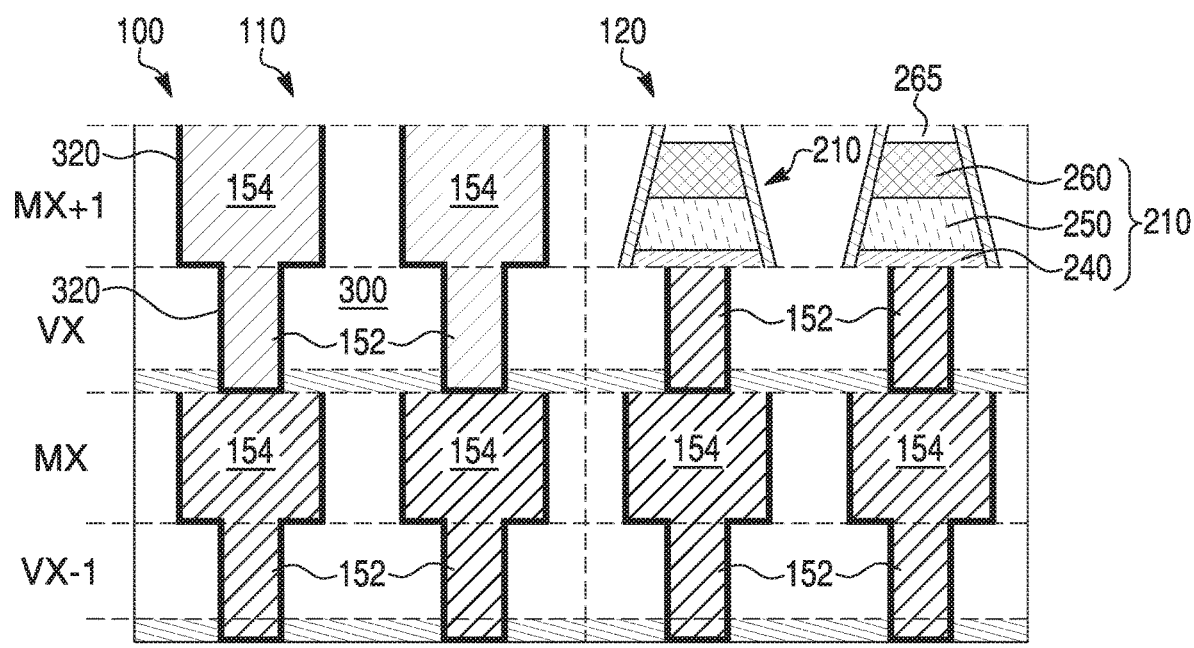

After planarization of the ILD surface (as shown in FIG. 4E), cavities or trenches 154' and 152' (corresponding to features 154 of the MX+1 layer and vias 152 of the VX layer) are formed on ILD 300 in the logic portion 110 of the device 100 as shown in FIG. 4F. These trenches 154' and 152' are then filled and polished to form the vias 152 of the VX layer and the features 154 of the MX+1 layer, as shown in FIG. 4G. Any process known in the art (e.g., a dual damascene process) may be used to form vias 152 and features 154. As explained previously, after forming the trenches 152', 154', barrier layer 320 may first be formed on the side walls of the trenches 152', 154', and the trenches 152', 154' then filled with copper. Filling the trenches 152', 154' with copper also deposits excess copper on the surface of ILD 300. A polishing step (e.g., copper CMP) may then be performed to remove this excess copper and expose the surface of the features 154. During the polishing, some of the ILD 300 will also be removed to expose a top surface of the MTJ devices 210 in the memory portion 120. See FIG. 4G. Although FIG. 4G shows a portion of the hard mask 265 above MTJ devices 210 as being exposed after the polishing, this is only exemplary. In some embodiments, the top electrode 260 (of the MTJ devices 210) may be exposed after the polishing. The portion of MTJ devices 210 that will be exposed may depend upon the selectivity of the encapsulant 350, the ILD 300, and/or the material of the top electrode 260 to the polishing process used.

Figure 4H:
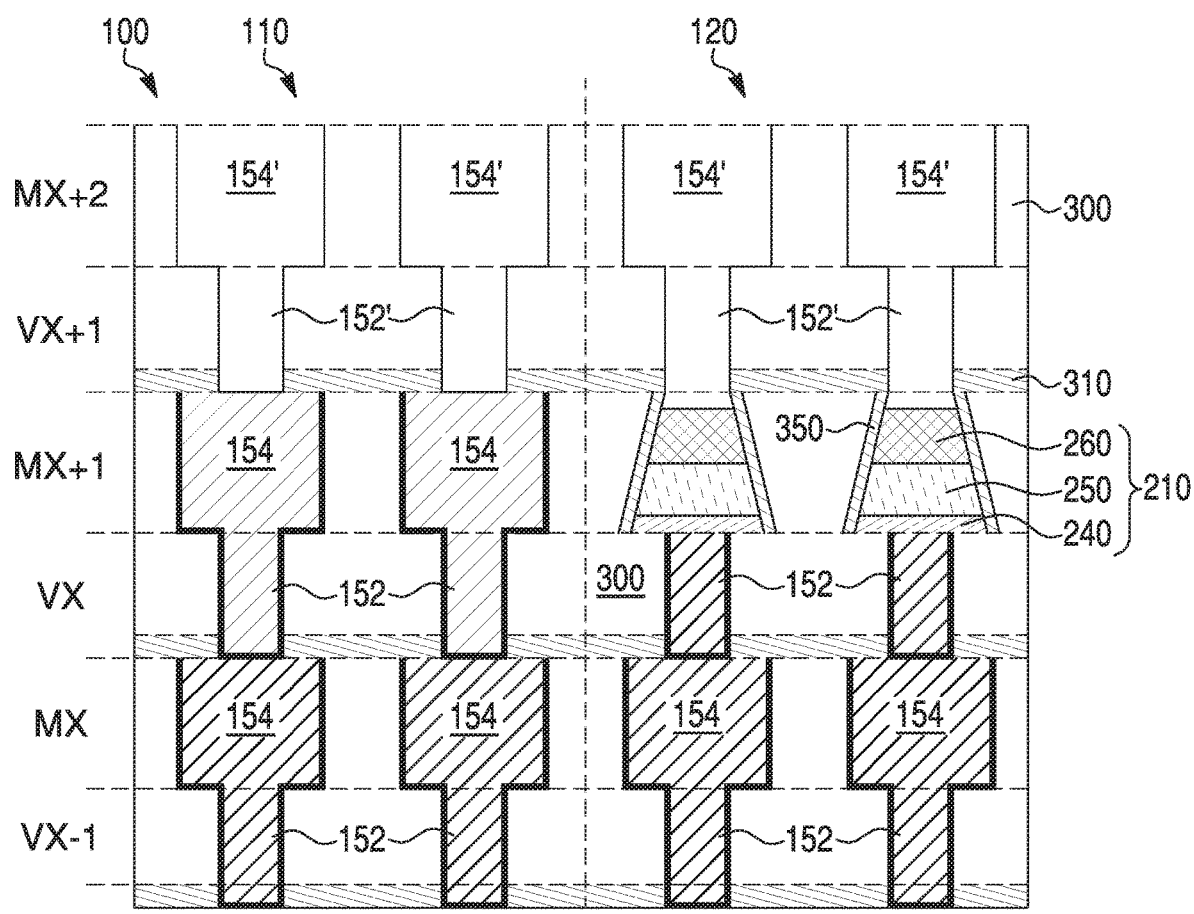
Figure 4I:
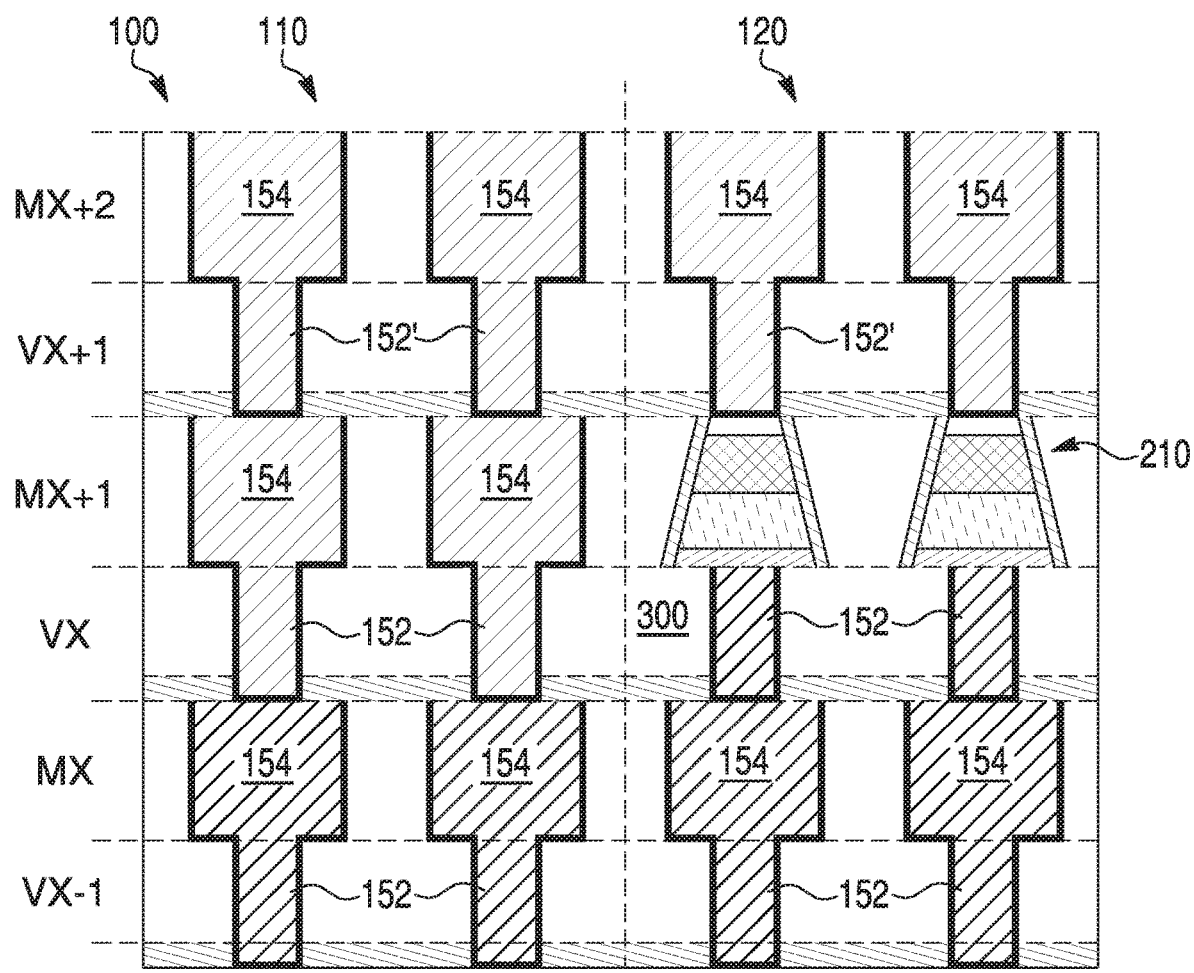
Figure 5A:
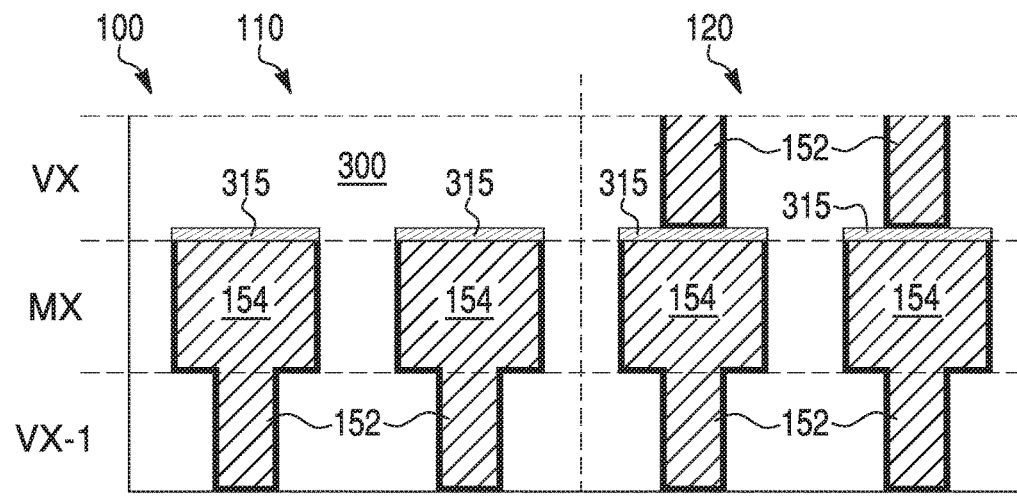
Figure 5B:
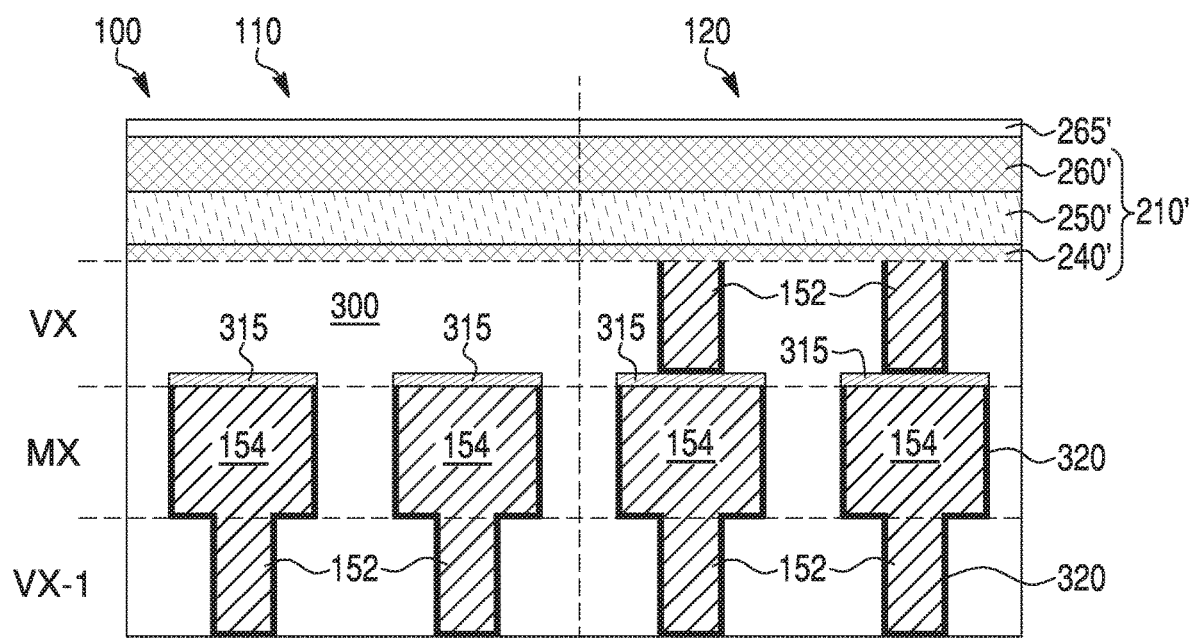
Figure 5C:
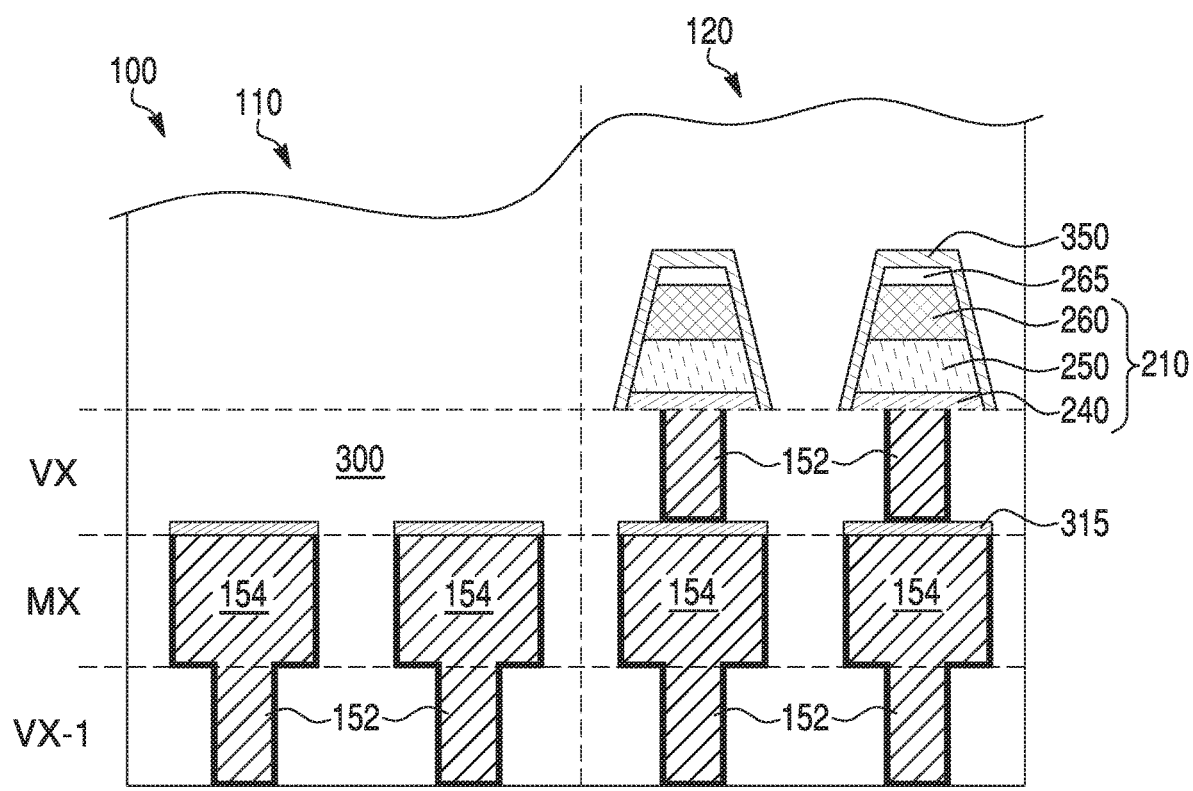
Figure 5D:
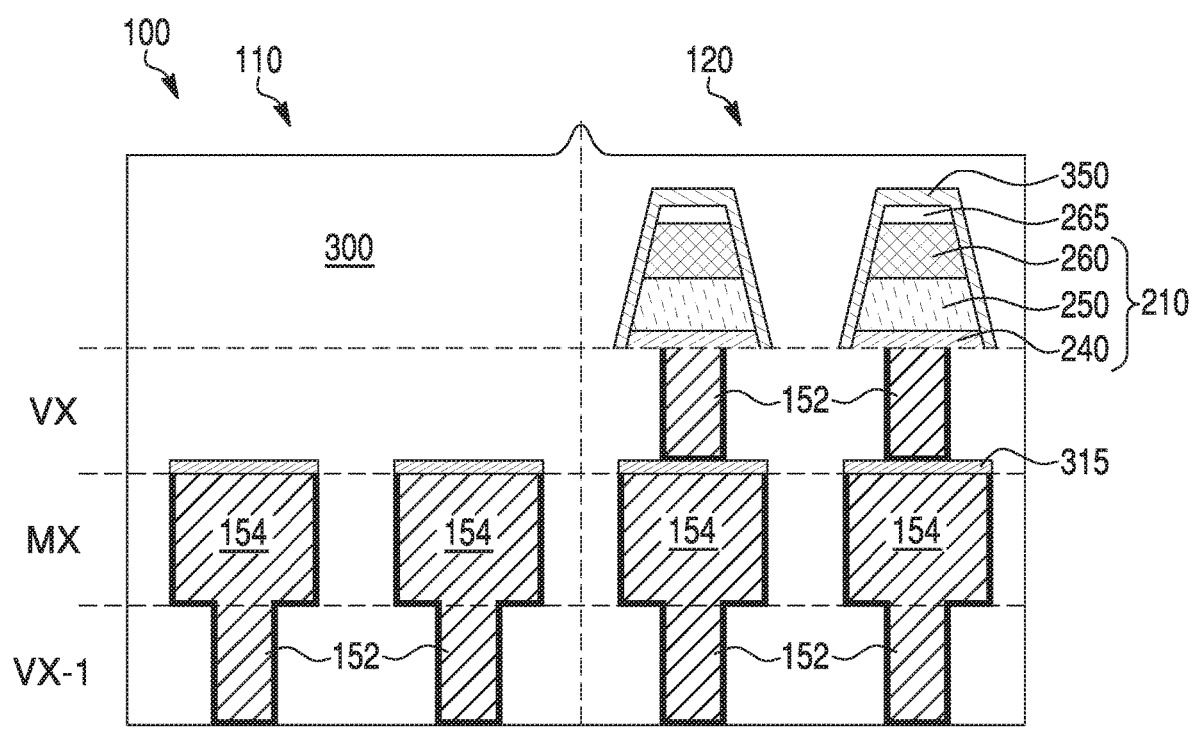
Figure 5E:
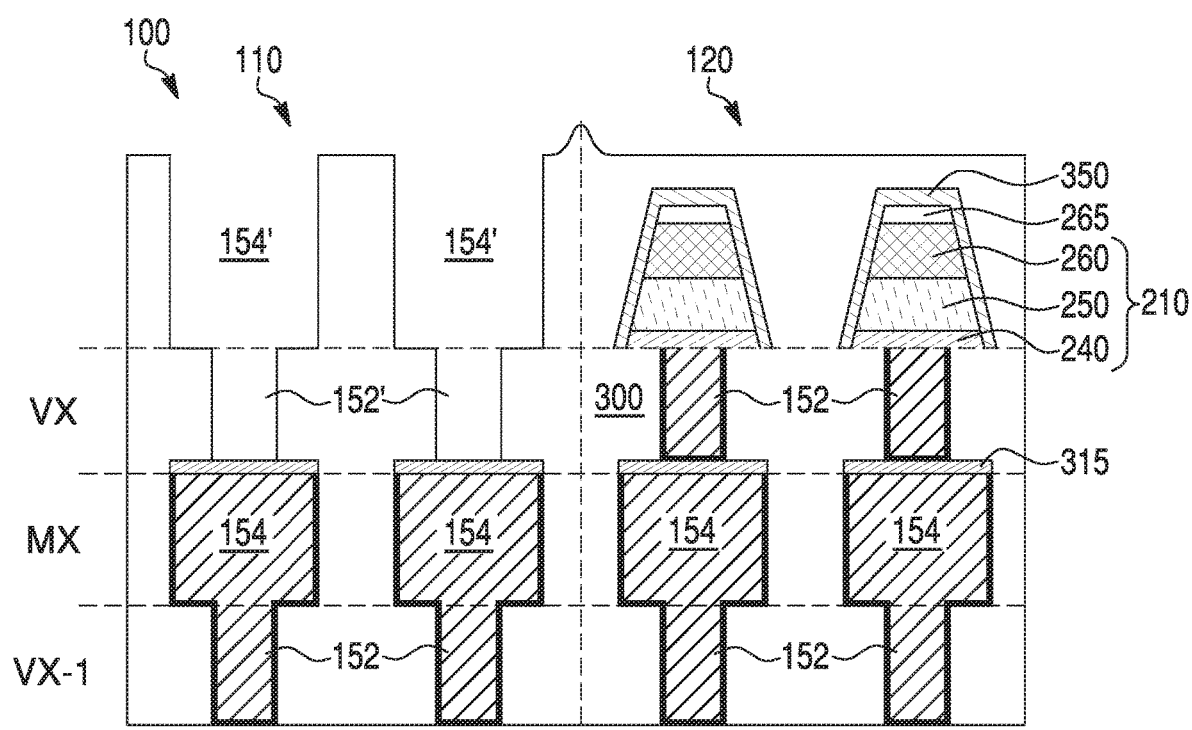
Figure 5F:
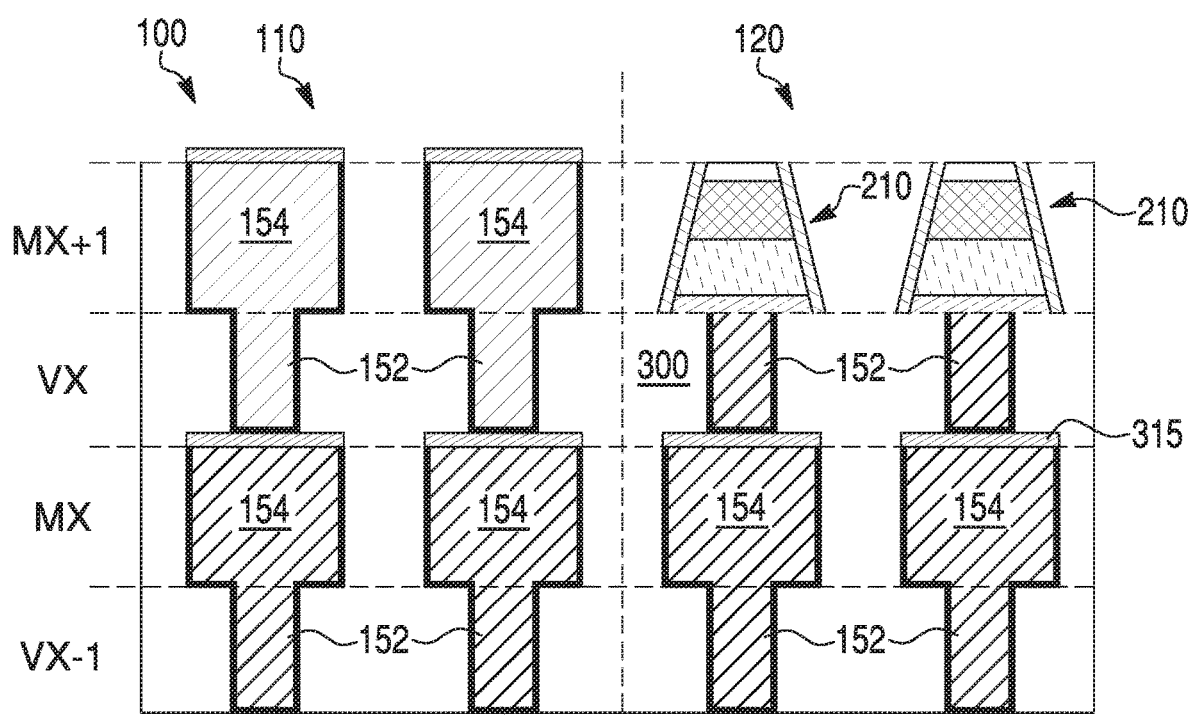
Figure 5G:
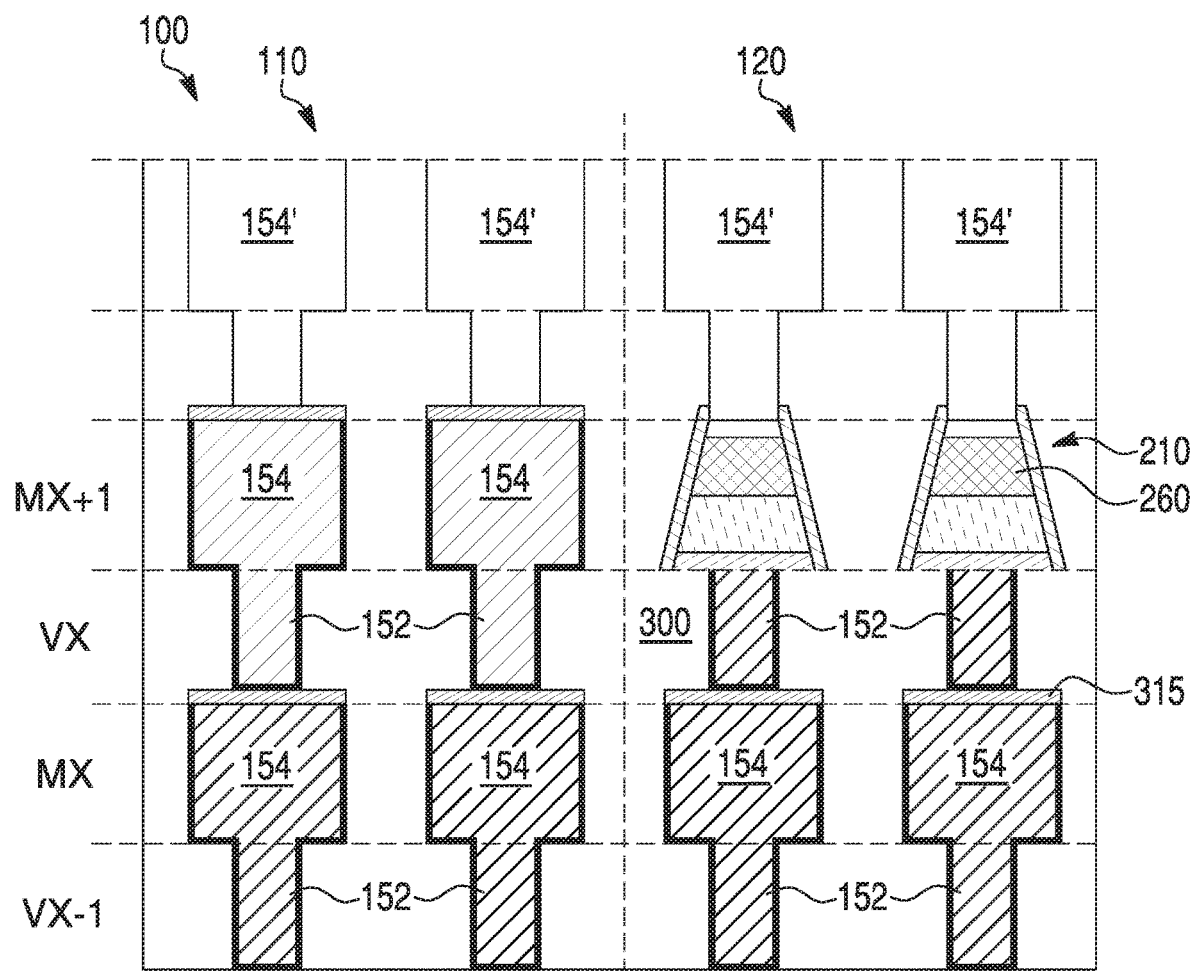
Figure 5H:
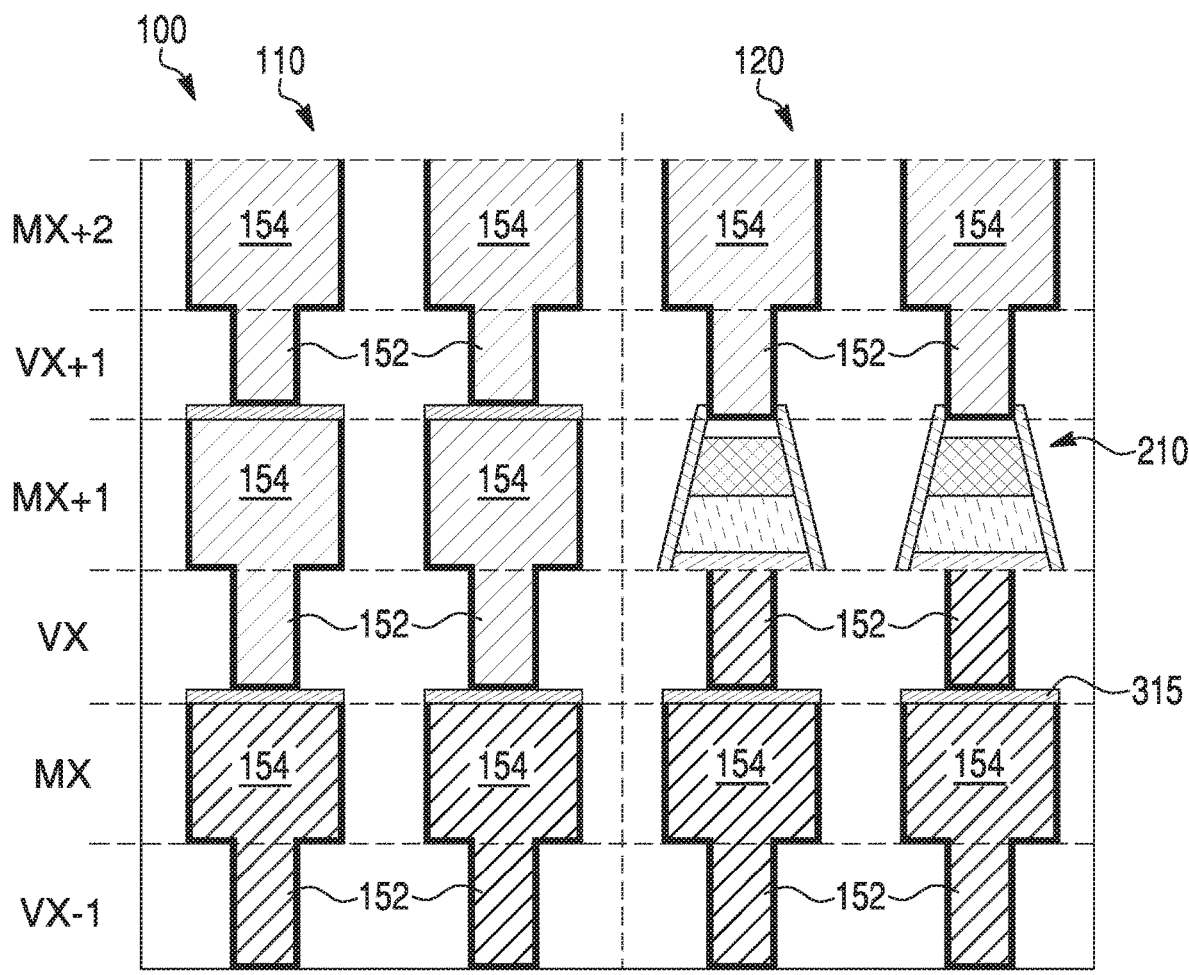

After exposing the top surface of the MX+1 metal layer features 154 of the logic portion 110, and the top of the MTJ devices 210 of the memory portion 120, through the surface of ILD 300 (as shown in FIG. 4G), capping layer 310 and ILD 300 is deposited over the exposed surfaces as shown in FIG. 4H. A dual damascene (or another suitable process) is then be used to etch trenches 152' and 154' through LD 300 and capping layer 310. These trenches 152' and 154' are then filled and polished to form the vias 152 of the VX+1 layer and features 154 of the MX+2 layer as illustrated in FIG. 4. While etching trench 152', if the etchant used in the etching process is selective to the materials of ILD 300 and capping layer 310, but not selective to the material of encapsulant 350 (that covers the side walls of MTJ devices 210), over-etch down the sides of MTJ device 210 can be prevented. That is, if the etchant etches the materials of the ILD 300 and capping layer 310 at a faster rate than it etches encapsulant 350 (if it etches encapsulant 350 at all), then after the etching process, the side walls of the MTJ devices 210 will still be covered by encapsulant 350, thereby preventing deposition of copper on the bit side walls during the subsequent via filling process. In some embodiments, to prevent over-etch of the encapsulant 350, ILD 300 may first be etched using a first etching process and the capping layer 310 may then be etched using a second etching process that is selective to the material of the capping layer 310 (as compared to encapsulant 350).

After exposing the features 154 of the MX+2 layer to form contacts, additional processing may then be carried on IC device 100 (of FIG. 4I) using conventional processing steps to complete the device. That is, additional layers (if any) may be formed, and other processing steps carried out to prepare IC device 100 for use in any desired application. These steps may include, for example, depositing one or more encapsulants on the partially formed IC device 100 (of FIG. 4I), polishing the deposited encapsulant to expose conductors connected to the encapsulated MTJ devices 210 of the memory portion 120 and the logic circuits of the logic portion 110, and forming a suitable bit contact structures to electrically connect with the MTJ devices 210 and logic circuits. Since these processes are well known in the art, they are not discussed in more detail herein. See, for example, commonly-assigned U.S. Pat. Nos. 9,548,442, 8,790,935, 8,877,522, 9,711,566, each of which is incorporated by reference in its entirety herein. It should be noted that many of the features described above with reference to FIGS. 4A-4I are exemplary. For example, the materials, structures, and the specific processing steps described are only illustrative, and any suitable material, structure, and/or processing step known in the art may be used instead of those described. For instance, although copper is described as the material used to fill vias 152 and features 154, any suitable electrically conductive material known in the art may be used in place of copper. Further, although a single ILD 300 is described as being used in all layers, this is also only exemplary. In some embodiments, different ILDs may be used in different layers or in the same layer.

It should also be noted that there may be many variations to the process steps described above. For example, FIGS. 5A-5H are cross-sectional illustrations of IC device 100 at different stages of another exemplary fabrication process. In the process illustrated in FIGS. 5A-5H, in place of the capping layer 310 uniformly deposited over every metal layer (see FIG. 3), a metallic capping layer 315 may be selectively deposited (or otherwise formed) over the features 154 formed on each metal layer to serve as a diffusion barrier. See FIG. 5H. Metallic capping layer 315 may include any suitable material (such as, for example, cobalt tungsten phosphide or CoWP), and it may be deposited on features 154 by any known process. In the fabrication process of FIGS. 5A-5H, after forming the vias 152 and features 154 of a via layer and a metal layer (e.g., forming the vias and features using a dual damascene process using, for example, copper), the metallic capping layer 315 is selectively formed over the features 154. See FIGS. 5A, 5F, and 5H. ILD 300 may then be deposited on these features and other processing steps carried out in a similar manner as described with reference to FIGS. 4A-4I. Since these processing steps are similar to those previously described with reference to FIGS. 4A-4I, for the sake of brevity, they are not repeated again. It should be noted that the process variation described with reference to FIGS. 5A-5H is only exemplary. Since possible variations in the fabrication process will be known to a person of ordinary skill in the art, they are not described herein.

FIG. 6 is a flow chart of an exemplary method 400 used to fabricate an exemplary IC device 100 of the current disclosure. In the discussion of method 400, reference will be made to FIGS. 4A-4I. Since many of the processing steps described below have been described previously with reference to FIGS. 4A-4I, they will not be described in detail below. In step 410, vias 152 and features 154 are formed on ILD 300 using, for example, a dual damascene process. See FIG. 4A. In step 420, a capping layer 310 and ILD 300 are deposited on the features 154 formed in step 410. See FIG. 4A. In step 430, vias 152 are formed using, for example, a single damascene process on ILD 300 deposited over the memory portion 120 in step 420. See FIG. 4B. In step 440, MTJ devices 210 are formed on the vias 152 formed in step 430 in the memory portion 120. See FIGS. 4C and 4D. In step 450, ILD 300 is deposited to form a conformal coating over the MTJ devices 210 and over the logic portion 110. See FIG. 4D. In step 460, vias 152 and features 154 are formed on ILD 300 in the logic portion 110 using, for example, a dual damascene process. See FIGS. 4F and 4G. In step 470, ILD 300 is again deposited. See FIG. 4H. In step 480, vias 152 and features 154 are formed on ILD 300 in both the logic and memory portions 110, 120 using, for example, a dual damascene process to contact the features 154 of the logic portion and the MTJ devices 210 in the memory portion. See FIG. 4I. In step 490, further processing is carried out using conventional processing techniques to complete the IC device.

As alluded to above, the magnetoresistive devices (formed using aforementioned described techniques and/or processes) may include a sensor architecture or a memory architecture (among other architectures). For example, in a magnetoresistive device having a memory configuration, the magnetoresistive devices may be electrically connected to an access transistor and configured to couple or connect to various conductors, which may carry one or more control signals, as shown in FIG. 7. The magnetoresistive devices may be used in any suitable application, including, e.g., in a memory configuration. In such instances, the magnetoresistive devices may be formed as an IC device comprising a discrete memory device (e.g., as shown in FIG. 8A) or an embedded memory device having a logic therein (e.g., as shown in FIG. 8B), each including MRAM, which, in one embodiment is representative of one or more arrays of MRAM having a plurality of magnetoresistive devices formed magnetoresistive stacks/structures, according to certain aspects of certain embodiments disclosed herein.

The disclosed process of integrating MTJ devices in a metal layer (rather than in a via layer as is traditionally done (see FIG. 2B)) has many advantages. In advanced technology nodes, the lower-layer metals (metal layers closer to the transistors) have scaled down height requirements compared to higher-layer metals. For example, in advanced technology nodes lower metal layers may have small vertical dimensions and higher metal layers may have large vertical dimensions. Being able to integrate MTJ devices in the lower metal layers has advantages for bitcell pitch reduction. Bitcell pitch reduction leads to reduced die area of IC device 100. A reason for the die area reduction is the relative small landing pad area requirements in the different metal layers to enable an integrated MTJ device to be connected to the associated transistor. The landing pad area requirement in the higher metal layers may force a larger pitch. As explained above, traditionally, an MTJ device was integrated in a IC device (e.g., an MRAM) by providing the MTJ device in the space occupied by a via layer (and in some known IC devices, in the space occupied by a metal layer and a via layer). In the current disclosure, the MTJ device is provided only in the metal layer. The height of the MTJ device is matched with the height of the metal layer. Higher metal layers tend to have taller rules than the lower via layers. Therefore, an MVia is not required, reducing the height requirement for MTJ integration. Beyond pitch improvement, the current integration method has the further advantage of enabling landing the MTJ device (or MTJ bit) on a smaller standard integration via rather than a larger metal landing pad or utilizing a custom MVia integration. The smaller via below the MTJ bit prevents the issue of re-depositing underlying metal material on to the bit sidewalls or between the bits, which would cause electrical shorts.

In some embodiments, an integrated circuit (IC) device is disclosed. The IC device includes a logic portion including logic circuits in multiple vertically stacked metal layers interconnected by one or more via layers, and a memory portion including a plurality of magnetoresistive devices. Each magnetoresistive device of the plurality of magnetoresistive devices may be provided in a single metal layer of the multiple vertically stacked metal layers.

Various embodiments of the disclosed IC device may, alternatively or additionally, include one or more of the following features: the logic portion may include a first via layer and a second via layer and a first metal layer between the first and second via layers, the plurality of magnetoresistive devices may be provided in the first metal layer, and vias of both the logic portion and the memory portion in the via layer have substantially the same configuration; the logic portion may include a first via layer and a second via layer and a first metal layer between the first and second via layers, the plurality of magnetoresistive devices may be provided in the first metal layer, and vias and metal layers of both the logic portion and the memory portion in the via layer may have substantially the same height; the logic portion may include a first metal layer, a second metal layer, a third metal layer, a first via layer between the first and second metal layers, and a second via layer between the second and third metal layers, the plurality of magnetoresistive devices may be provided in the second metal layer, vias of both the logic portion and the memory portion in the first via layer may have substantially the same configuration, and vias of both the logic portion and the memory portion in the second via layer may have substantially the same configuration; the logic portion includes a first metal layer, a second metal layer, a third metal layer, a first via layer between the first and second metal layers, and a second via layer between the second and third metal layers, the plurality of magnetoresistive devices may be provided in the second metal layer, vias and metal layers of both the logic portion and the memory portion in the first interconnect layer have substantially the same height, and vias and metal layers of both the logic portion and the memory portion in the second interconnect layer have substantially the same height; the logic portion may include a first metal layer and a second metal layer and a first via layer between the first and second metal layers, and the plurality of magnetoresistive devices may be provided in the second metal layer such that each magnetoresistive device of the plurality of magnetoresistive devices land on vias of the via layer that have a smaller width that the magnetoresistive device; each magnetoresistive device of the plurality of magnetoresistive devices may have substantially the same thickness as features in the single metal layer on which the plurality of magnetoresistive devices is provided; each magnetoresistive device of the plurality of magnetoresistive devices may have a single fixed magnetic region separated from a single free magnetic region by an intermediate region; each magnetoresistive device of the plurality of magnetoresistive devices may have a dual spin filter configuration; the IC device may further include one or more interlayer dielectrics (ILDs) between features of the multiple vertically stacked metal layers and vias of the one or more via layers.

In some embodiments, a method of fabricating an integrated circuit device including a memory portion and a logic portion is disclosed. The method may include forming a plurality of first vias on the memory portion, forming a plurality of magnetoresistive devices in the memory portion such that each magnetoresistive device of the plurality of magnetoresistive devices land on a first via of the plurality of vias, forming a plurality of second vias in the logic portion, and forming a plurality of features in the logic portion such that at least one feature of the plurality of features land on a second via of the plurality of second vias, and a height of the plurality of features is substantially the same as a height of the plurality of magnetoresistive devices.

Various embodiments of the disclosed method may, alternatively or additionally, include one or more of the following features: the vias of the plurality of first vias may have substantially the same configuration as vias of the plurality of second vias; the vias of the plurality of first vias may have substantially the same height as vias of the plurality of second vias; the method may further include forming a plurality of third vias in the logic portion and the memory portion, wherein at least one via of the plurality of third vias land on a feature of the plurality of features in the logic portion, and at least one via of the plurality of third vias land on a magnetoresistive devices of the plurality of magnetoresistive devices in the memory portion; the plurality of second vias in the logic portion and the plurality of features in the logic portion may be formed using a dual damascene process; the method may further include depositing an interlayer dielectric (ILD) over the plurality of features in the logic portion and the plurality of magnetoresistive devices in the memory portion, planarizing a surface of the deposited ILD, and forming a plurality of third vias on the deposited ILD to contact the plurality of features and the plurality of magnetoresistive devices.

In some embodiments, an integrated circuit (IC) device is disclosed. The IC device may include a first metal layer, a second metal layer, and a first via layer between the first and second metal layers, a logic portion including logic circuits interconnected by the first metal layer, the second metal layer, and the first via layer, and a memory portion including a plurality of magnetoresistive devices provided in the second metal layer. A combined height of a magnetically free region, a magnetically fixed region, and an intermediate region positioned between the magnetically free region and the magnetically fixed region of at least one magnetoresistive device of the plurality of magnetoresistive devices may be less than or equal to a height of the second metal layer.

Various embodiments of the disclosed IC device may, alternatively or additionally, include one or more of the following features: the first via layer may include a plurality of first vias interconnecting the first metal layer and the second metal layer in the logic portion and the memory portion, wherein the first vias in both the logic portion and the memory portion may have substantially the same height; the IC device may include a third metal layer above the second metal layer and a second via layer between the second and third metal layers, wherein the first via layer may include a plurality of first vias interconnecting the first metal layer and the second metal layer in the logic portion and the memory portion, the second via layer may include a plurality of second vias interconnecting the second metal layer and the third metal layer in the logic portion and the memory portion, the first vias in both the logic portion and the memory portion may have substantially the same configuration, and the second vias in both the logic portion and the memory portion may have substantially the same configuration; the IC device may further include a third metal layer above the second metal layer and a second via layer between the second and third metal layers, wherein the first via layer may include a plurality of first vias interconnecting the first metal layer and the second metal layer in the logic portion and the memory portion, the second via layer may include a plurality of second vias interconnecting the second metal layer and the third metal layer in the logic portion and the memory portion, the first vias in both the logic portion and the memory portion may have substantially the same height, and the second vias in both the logic portion and the memory portion may have substantially the same height; and the plurality of magnetoresistive devices may be provided in the second metal layer such that each magnetoresistive device lands on vias of the first via layer that have a smaller width that the magnetoresistive device.

Although various embodiments of the present disclosure have been illustrated and described in detail, it will be readily apparent to those skilled in the art that various modifications may be made without departing from the present disclosure or from the scope of the appended claims.

What is claimed is:

1. An integrated circuit device, comprising:
    a logic portion including logic circuits in multiple vertically stacked metal layers interconnected by one or more via layers; and
    a memory portion including a plurality of magnetoresistive devices, wherein each magnetoresistive device of the plurality of magnetoresistive devices is provided in a single metal layer of the multiple vertically stacked metal layers, wherein each magnetoresistive device of the plurality of magnetoresistive devices has a dual spin filter configuration.

2. The integrated circuit device of claim 1, wherein (a) the logic portion includes a first via layer and a second via layer and a first metal layer between the first and second via layers, (b) the plurality of magnetoresistive devices are provided in the first metal layer, and (c) vias in the first and second via layers of both the logic portion and the memory portion have substantially the same configuration.

3. The integrated circuit device of claim 1, wherein (a) the logic portion includes a first via layer and a second via layer and a first metal layer between the first and second via layers, (b) the plurality of magnetoresistive devices are provided in the first metal layer, and (c) vias in the first and second via layers of both the logic portion and the memory portion have substantially the same height.

4. The integrated circuit device of claim 1, wherein (a) the logic portion includes a first metal layer, a second metal layer, a third metal layer, a first via layer between the first and second metal layers, and a second via layer between the second and third metal layers (b) the plurality of magnetoresistive devices are provided in the second metal layer, (c) vias of both the logic portion and the memory portion in the first via layer have substantially, the same configuration, and (d) vias of both the logic portion and the memory portion in the second via layer have substantially the same configuration.

5. The integrated circuit device of claim 1, wherein (a) the logic portion includes a first metal layer, a second metal layer, a third metal layer, a first via layer between the first and second metal layers, and a second via layer between the second and third metal layers (b) the plurality of magnetoresistive devices are provided in the second metal layer, (c) vias and metals of both the logic portion and the memory portion in the first via layer have substantially the same height, and (d) vias and metals of both the logic portion and the memory portion in the second via layer have substantially the same height.

6. The integrated circuit device of claim 1, wherein (a) the logic portion includes a first metal layer and a second metal layer and a first via layer between the first and second metal layers, and (b) the plurality of magnetoresistive devices are provided in the second metal layer such that each magnetoresistive device of the plurality of magnetoresistive devices land on vias of the via layer that have a smaller width than the magnetoresistive device.

7. The integrated circuit device of claim 1, wherein each magnetoresistive device of the plurality of magnetoresistive devices have substantially the same thickness as features in the single metal layer on which the plurality of magnetoresistive devices is provided.

8. The integrated circuit device of claim 1, further including one or more interlayer dielectrics (ILDs) between features of the multiple vertically stacked metal layers and vias of the one or more via layers.

9. The integrated circuit device of claim 1, wherein at least one magnetoresistive device of the plurality of magnetoresistive devices includes a synthetic antiferromagnetic structure, a synthetic ferromagnetic structure, or both.

10. An integrated circuit device, comprising:
    a first metal layer, a second metal layer, and a first via layer between the first and second metal layers;
    a logic portion including logic circuits interconnected by the first metal layer, the second metal layer, and the first via layer; and
    a memory portion including a plurality of magnetoresistive devices provided in the second metal layer, wherein each magnetoresistive device of the plurality of magnetoresistive devices has a dual spin filter configuration; and
    wherein a combined height of a magnetically free region, a magnetically fixed region, and an intermediate region positioned between the magnetically free region and the magnetically, fixed region of at least one magnetoresistive device of the plurality of magnetoresistive devices is less than or equal to a height of the second metal layer.

11. The integrated circuit device of claim 10, wherein the first via layer includes a plurality of first vias interconnecting the first metal layer and the second metal layer in the logic portion and the memory portion, and wherein the first vias in both the logic portion and the memory portion have substantially the same height.

12. The integrated circuit device of claim 10, further including a third metal layer above the second metal layer and a second via layer between the second and third metal layers, wherein (a) the first via layer includes a plurality of first vias interconnecting the first metal layer and the second metal layer in the logic portion and the memory portion, (b) the second via layer includes a plurality of second vias interconnecting the second metal layer and the third metal layer in the logic portion and the memory portion, (c) the first vias in both the logic portion and the memory portion have substantially the same configuration, and (d) the second vias in both the logic portion and the memory portion have substantially the same configuration.

13. The integrated circuit device of claim 10, further including a third metal layer above the second metal layer and a second via layer between the second and third metal layers, wherein (a) the first via layer includes a plurality of first vias interconnecting the first metal layer and the second metal layer in the logic portion and the memory portion (b) the second via layer includes a plurality of second vias interconnecting the second metal layer and the third metal layer in the logic portion and the memory portion, (c) the first vi as in both the logic portion and the memory portion have substantially the same height, and (d) the second vias in both the logic portion and the memory portion have substantially the same height.

14. The integrated circuit device of claim 10, wherein the plurality of magnetoresistive devices are provided in the second metal layer such that each magnetoresistive device of the plurality of magnetoresistive devices land on vias of the first via layer that have a smaller width than the magnetoresistive device.

15. The integrated circuit device of claim 10, wherein at least one magnetoresistive device of the plurality of magnetoresistive devices includes a synthetic antiferromagnetic structure, a synthetic, ferromagnetic structure, or both.

16. An integrated circuit device, comprising:
a first via layer;
a second via layer;
a first metal layer between the first via layer and the second via layer;
a logic portion including logic circuits in multiple vertically stacked metal layers interconnected by one or more via layers, wherein the multiple vertically stacked metal layers includes the first metal layer, and the one or more via layers includes the first via layer; the second via layer, or both; and
a memory portion including a plurality of magnetoresistive devices, wherein each magnetoresistive device plurality of magnetoresistive devices is located between the first via layer and the second via layer, and at least one magnetoresistive device of the plurality of magnetoresistive devices has a dual spin configuration.

17. The integrated circuit device of claim 16, wherein a height of the first metal layer is greater than a combined height of the first via layer and the second via layer.

18. The integrated circuit device of claim 16, wherein a height of the first via layer is at least about one-third of the height of the first metal layer.

19. The integrated circuit device of claim 16, wherein at least one magnetoresistive device of the plurality of magnetoresistive devices has exactly one fixed magnetic region and exactly one free magnetic region.

20. The integrated circuit device of claim 16, wherein the multiple vertically stacked metal layers further comprise a second metal layer and a third metal layer.

21. The integrated circuit device of claim 20, wherein the one or more via layers include the first via layer and the second via layer, and further include a third via layer positioned between the second metal layer and the third metal layer.

* * * * *